United States Patent [19]
Matsuda

[11] Patent Number: 6,088,377
[45] Date of Patent: Jul. 11, 2000

[54] OPTICAL SEMICONDUCTOR DEVICE HAVING A DIFFRACTION GRATING AND FABRICATION PROCESS THEREOF

[75] Inventor: Manabu Matsuda, Kawasaki, Japan

[73] Assignee: Fujitsu Limited, Kawasaki, Japan

[21] Appl. No.: 09/332,890

[22] Filed: Jun. 15, 1999

Related U.S. Application Data

[62] Division of application No. 08/923,255, Sep. 4, 1997, Pat. No. 5,981,307.

[30] Foreign Application Priority Data

Jan. 27, 1997 [JP] Japan ................................ 9-012692

[51] Int. Cl.$^7$ ..................................................... H01S 3/085
[52] U.S. Cl. ................................ 372/50; 372/45; 372/46; 372/96
[58] Field of Search ................................ 372/50, 102, 46, 372/45, 96, 48; 385/14, 28, 37, 39, 50

[56] References Cited

U.S. PATENT DOCUMENTS 5,960,023  9/1999  Takahashi ................................ 372/96

FOREIGN PATENT DOCUMENTS 6097600  4/1994  Japan .

*Primary Examiner*—James W. Davie
*Attorney, Agent, or Firm*—Armstrong, Westerman, Hattori, McLeland & Naughton

[57] ABSTRACT

A method of fabricating an optical semiconductor device includes the steps of irradiating a substrate by a first optical beam and a second optical beam such that the first and second optical beams form interference fringes on the substrate, exposing a resist film provided on the substrate by the interference fringes to form a resist pattern, and forming a diffraction grating pattern on the substrate in accordance with the interference fringes by using the resist pattern as a mask. The first and second optical beams are irradiated such that a wavefront of the first optical beam and a wavefront of the second optical beam intersect at an intersection line parallel to the substrate, and the irradiating step is conducted by refracting the first and second optical beams by an optical element having a smooth surface inclined with respect to a plane parallel to the substrate in the direction of the foregoing intersection line and further inclined in a perpendicular direction.

4 Claims, 27 Drawing Sheets

2nd direction

OPTICAL SEMICONDUCTOR DEVICE HAVING A DIFFRACTION GRATING AND FABRICATION PROCESS THEREOF

This application is a division of prior application Ser. No. 08/923,255 filed Sep. 4, 1997, U.S. Pat. No. 5,981,307.

BACKGROUND OF THE INVENTION

The present invention generally relates to optical semiconductor devices and more particularly to fabrication of a laser diode having a diffraction grating.

Laser diodes are used extensively in the field of optical information processing including optical telecommunication.

In the field of optical telecommunication, various optical modulation methods are proposed so far for transmitting as much information as possible via a single optical fiber. Among others, the optical wavelength multiplexing method, in which a number of optical signals having respective, various wavelengths are transmitted through an optical fiber in the form of a wavelength multiplexed optical signal, is a promising process for increasing the amount of information transmitted through the optical fiber. In order to realize such an optical wavelength multiplex system, it is necessary to provide a number of laser diodes that is capable of oscillating at respective, mutually different wavelengths with stability and reliability.

A laser diode generally includes an optical cavity and an active layer in which stimulated emission of photons occurs. In the laser diodes for use in the foregoing wavelength multiplexing system, however, it is preferable and advantageous to use a diffraction grating in place of the optical cavity, as in the case of a DFB (distribution feedback) laser diode, so as to be able to set the oscillation wavelength of the laser diode to a desired wavelength. Further, the use of a DBR laser diode, in which the reflectors of the optical cavity are replaced by a diffraction grating, is also possible. By using such a diffraction grating, it is possible to change the wavelength of the optical beam that causes a resonance with the diffraction grating easily by changing the pitch of the diffraction grating. In other words, it is possible to fabricate the laser diodes easily to have respective oscillation wavelengths so as to be coincident to the desired wavelengths of the optical signal components, by setting the diffraction grating pitch in accordance with the desired optical wavelengths.

FIGS. 1A–1C show the construction of a DFB laser diode proposed in the U.S. Pat. No. 5,170,402, wherein FIGS. 1A and 1C show the laser diode in a longitudinal cross-sectional view and in a lateral cross-sectional view respectively, while FIG. 1C shows a photon density profile in the laser diode along a longitudinal direction thereof.

Referring to FIGS. 1A and 1C, the laser diode is constructed on a substrate 1 of n-type InP on which a diffraction grating 1A is formed such that the diffraction grating 1A extends in the longitudinal direction of the laser diode.

On the diffraction grating 1A, a waveguide layer 2 of n-type InGaAsP is provided, and an active layer 3 having an MQW (multiple quantum well) structure is provided on the waveguide layer 2. It should be noted that the MQW structure of the active layer 3 includes an alternate repetition of a quantum well layer of undoped GaInAs and an undoped barrier layer of GaInAsP, wherein the quantum well layer has a thickness below a de Broglie wavelength of the carriers in the quantum well layer. By reducing the thickness of the quantum well layer as such, quantum levels are formed in the quantum well layer.

On the active layer 3, a cladding layer 4 of p-type InGaAsP and a cap layer of P$^+$-type InGaAsP are provided successively, and ohmic electrodes 6A, 6B and 6C are provided on the cap layer 5 such that the electrodes 6A, 6B and 6C are aligned in the longitudinal direction of the laser diode. Further, a lower electrode 7 is provided on the lower major surface of the substrate 1 in ohmic contact therewith.

In the illustrated example, the laser diode includes a $\underline{\Lambda}/2$ phase-shift point 1B at a mid point of the diffraction grating 1A in which the pitch of the diffraction grating 1A is shifted in the longitudinal direction of the laser diode by $\underline{\Lambda}/2$, wherein $\underline{\Lambda}$ represents the pitch of the diffraction grating 1A. In terms of the optical beam that is diffracted in the waveguide layer 2 by the diffraction grating 1A, the foregoing $\underline{\Lambda}/2$ phase-shift point 1B induces an optical phase shift of $\lambda/4$ in the optical beam, wherein $\lambda$ represents the wavelength of the optical beam. By forming the $\underline{\Lambda}/2$ phase shift point 1B as such, the photon density in the active layer 3 becomes maximum in correspondence to the phase shift point 1B provided at the longitudinally midpoint of the laser diode as indicated in FIG. 1B. It should be noted that such a maximum of the photon density in turn induces a minimum of the carrier density due to the facilitated stimulated emission caused by the maximum photon emission.

Thus, it becomes possible, in the laser diode of FIGS. 1A–1C, to modulate the carrier density profile and hence the refraction index of the laser diode effectively by injecting a signal current via the electrode 6B provided in correspondence to such a minimum of the carrier distribution profile, while simultaneously driving the laser diode by injecting driving currents via the electrodes 6A and 6C. In other words, the laser diode functions as a tunable laser diode.

When constructing a wavelength multiplex telecommunication system by using such a laser diode, it is necessary to fabricate a number of tunable laser diodes such that the laser diodes have respective central wavelengths different from each other. For this purpose, there is a need for a technology that enables formation of the devices having the respective diffraction gratings with mutually different grating pitches.

While it is not particularly difficult to change the diffraction grating pitch device by device, the laser diodes for use in a wavelength multiplex telecommunication system are desired to be provided in the form of optical integrated circuit in which the laser diodes having respective, different wavelengths are formed on a common substrate. In such a case, it is necessary to form a number of such diffraction gratings on a common substrate with mutually different pitches.

Conventionally, the diffraction grating of a DFB laser diode or a DBR laser diode has been formed by a dual-beam interference exposure process that uses interference fringes formed as a result of interference of two optical beams.

FIG. 2 shows the principle of forming the diffraction grating by such a dual-beam interference exposure process.

Referring to FIG. 2, an optical beam having a wavelength $\lambda$ produced by a coherent source such as a He-Cd laser is split into a first optical beam and a second optical beam, and the first and second optical beams thus split are directed to a substrate on which the diffraction grating is to be formed, with respective incident angles $\Theta_1$ and $\Theta_2$. The substrate is covered by a photoresist film, and the photoresist film is exposed according to a desired diffraction grating pattern with a pitch $\underline{\Lambda}_1$, which is given as $$\underline{\Lambda}_1 = \underline{\lambda}/(\sin \Theta_1 + \sin \Theta_2).$$

In the exposure process of FIG. 2, it should be noted that the incident angles $\Theta_1$ and $\Theta_2$ are converted to incident angles $\Theta_3$ and $\Theta_4$ respectively by disposing a prism as indicated in FIG. 3, wherein the incident angles $\Theta_3$ and $\Theta_4$ are given according to the relationship $$\Theta_3 = \sin^{-1}[n \times \sin\{\sin^{-1}(\sin\{(\Theta_1+\phi)/n\}-\phi\}]$$

$$\Theta_4 = \sin^{-1}[n \times \sin\{\sin^{-1}(\sin\{(\Theta_2-\phi)/n\}+\phi\}]$$

where $\phi$ represents a slope angle of the inclined surface of the prism shown in FIG. 3, while n represents the refractive index of the prism.

When such a prism is used, the exposed diffraction pattern now has a pitch $\Lambda_2$ given according to the relationship $$\Lambda_2 = \lambda/(\sin \Theta_3 + \sin \Theta_4).$$

Thus, the inventor of the present invention has previously proposed, in the Japanese Laid-Open Patent Publication 63-341879, an exposure process of a diffraction grating that uses a prism shown in FIG. 4 in the dual-beam interference exposure process of FIG. 4, such that the pitch of the exposed diffraction pattern changes in a first area on the substrate and in a second area of the substrate. A similar proposal is made in the Japanese Laid-Open Patent Publication 6-97600.

FIG. 5A shows a prism 10 that is proposed in the Japanese Laid-Open Patent Publication 63-97600, op. cit., while FIG. 5B shows an example of the diffraction pattern exposed by using the prism 10 of FIG. 5A.

Referring to FIG. 5A, the prism 10 includes a plurality of regions 10A–10D having respective, different inclination angles for the sloped surface, and thus, the substrate 11 is formed with diffraction gratings 11A–11D with respective pitches in correspondence to the foregoing prism regions 10A–10D.

In the construction of FIG. 4 or FIGS. 5A and 5B, it should be noted that there is formed a step between adjacent sloped surfaces of the prism. As such a step causes a diffraction in the optical beam passing through the prism, the diffraction grating pattern exposed on the substrate is substantially distorted from the ideal pattern shown in FIG. 5B as a result of the diffraction of the optical beam thus caused. This problem is particularly serious in the laser diode array for use in wavelength multiplexed optical telecommunication systems, in which the laser diodes are arranged on a common substrate adjacent with each other with a minute interval or mutual separation. Further, it should be noted that the prism 10 of FIG. 5A is preferably manufactured such that each of the regions 10A–10D has a width of about 300 µm or less. However, precise formation of such a small prism surface is difficult.

It is of course possible to form a diffraction grating pattern on a substrate with a varying grating pitch, by using an electron beam exposure system and process. However, such an electron beam exposure of the diffraction grating pattern needs enormously long time, as the grating pattern has to be exposed one line by one line by using a single electron beam. Further, the diffraction grating pattern formed by an electron beam exposure process tends to show a fluctuation of grating pitch due to a voltage fluctuation.

SUMMARY OF THE INVENTION

Accordingly, it is a general object of the present invention to provide a novel and useful fabrication process of an optical semiconductor device as well as a method of forming a diffraction grating used therein wherein the foregoing problems are eliminated.

Another and more specific object of the present invention is to provide a fabrication process of a light-emitting optical semiconductor device including a plurality of laser diodes each including a diffraction grating formed on a common substrate, with respective diffraction grating pitches that are different from each other, wherein the mutually different diffraction gratings are formed simultaneously.

Another object of the present invention is to provide a method of forming a plurality of diffraction grating patterns simultaneously such that the diffraction gratings have respective, mutually different grating pitches.

Another object of the present invention is to provide a method of fabricating an optical semiconductor device, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line parallel to a principal surface of said substrate;

said irradiating step further including a step of refracting said first and second optical beams by an optical element disposed in optical paths of said first and second optical beams, said optical element having a smooth surface inclined with respect to a plane parallel to said principal surface of said substrate in a first direction parallel to a direction of said intersection line and further inclined with respect to said plane in a second direction perpendicular to said first direction.

According to the present invention, it becomes possible to form a diffraction grating pattern on a single substrate such that the grating pitch as measured in the second direction changes continuously along the grooves extending in the first direction and forming the diffraction grating pattern. By forming a number of laser diode on such a diffraction grating pattern, it becomes possible to form a laser diode array in which laser diodes of different oscillation wavelengths are monolithically integrated.

Another object of the present invention is to provide a method of fabricating an optical semiconductor device, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line parallel to a principal surface of said substrate;

said irradiating step further including a step of refracting said first and second optical beams by an optical element disposed in optical paths of said first and second optical beams, said optical element including a plurality of regions aligned in a first direction parallel to a direction of said intersection line;

each of said regions having a smooth surface inclined with respect to said principal surface of said substrate in said first direction and further inclined with respect to said principal surface in a second direction perpendicular to said first direction.

According to the present invention, it becomes possible to form a number of diffraction patterns on a substrate repeatedly in the first direction, such that the grating pitch as measured in the second direction changes continuously along the grooves extending in the first direction in each of the diffraction patterns. By forming a number of laser diode on each of such diffraction grating patterns, it becomes possible to form a number of laser diode arrays in each of which laser diodes of different oscillation wavelengths are monolithically integrated.

Another object of the present invention is to provide a method of fabricating an optical semiconductor device, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line extending in a first direction parallel to a principal surface of said substrate;

said irradiating step further including a step of refracting said first and second optical beams by an optical element disposed in optical paths of said first and second optical beams, said optical element having a smooth surface inclined with respect to said principal surface of said substrate in a second direction perpendicular to said first direction.

According to the present invention, it becomes possible to form a diffraction grating pattern on a substrate such that the grating pitch as measured in the second direction changes continuously in the second direction. By forming a laser diode structure on such a diffraction grating pattern and by dividing the structure thus obtained along the cleaving lines extending in the first direction, it becomes possible to form a number of DFB laser diodes having different oscillation wavelengths.

Another object of the present invention is to provide a method of fabricating an optical semiconductor device, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line extending in a first direction parallel to a principal surface of said substrate;

said irradiating step further including a step of refracting said first and second optical beams by an optical element disposed in optical paths of said first and second optical beams, said optical element including a plurality of regions aligned in a first direction parallel to a direction of said intersection line;

each of said regions having a smooth surface inclined with respect to said principal surface of said substrate in a second direction perpendicular to said first direction.

According to the present invention, it becomes possible to form a plurality of diffraction grating patterns repeatedly in the first direction such that the grating pitch as measured in the second direction changes continuously along the grooves extending in the first direction in each of the diffraction grating patterns. By forming a laser diode structure on each of such diffraction grating patterns and by dividing the laser diode structure thus obtained along cleaving lines extending in the first and second directions, it becomes possible to form a number of DFB laser diodes having different oscillation wavelengths.

Another object of the present invention is to provide an optical semiconductor device, comprising:

a semiconductor substrate having a first conductivity type and extending in first and second directions;

a diffraction grating pattern provided on said semiconductor substrate and including a plurality of grooves generally extending in said first direction, said grooves being repeated in said second direction with a pitch such that said pitch changes continuously along said grooves in said first direction;

an optical waveguide layer provided on said semiconductor substrate so as to cover said diffraction grating pattern;

an active layer provided on said optical waveguide layer;

a cladding layer having a second conductivity type and provided on said active layer; and a conductor layer provided on said cladding layer with said second conductivity type.

According to the present invention, a laser diode array in which a number of DFB laser diodes each having different oscillation wavelengths are integrated are obtained immediately.

Another object of the present invention is to provide an optical semiconductor device, comprising:

a semiconductor substrate having a first conductivity type and extending in first and second directions;

a diffraction grating pattern provided on said semiconductor substrate and including a plurality of grooves generally extending in said first direction, said grooves being repeated in said second direction with a pitch such that said pitch changes continuously in said second direction;

an optical waveguide layer provided on said semiconductor substrate so as to cover said diffraction grating pattern;

an active layer provided on said optical waveguide layer;

a cladding layer having a second conductivity type and provided on said active layer; and a conductor layer provided on said cladding layer with said second conductivity type.

According to the present invention, a number of laser diode arrays, in each of which a number of DFB laser diodes each having different oscillation wavelengths are integrated, are obtained simply and simultaneously by merely cleaving the obtained structure along cleaving lines extending in the first direction.

Another object of the present invention is to provide a laser diode array, comprising:

a semiconductor substrate having a first conductivity type and extending in first and second directions;

a plurality of mesa regions each provided on said semiconductor substrate so as to extend in said second direction, each of said mesa regions being defined by first and second side walls and repeated in said second direction;

a diffraction grating pattern provided in each of said mesa regions, said diffraction grating pattern including a plurality of grooves each extending generally in said first direction and repeated in said second direction with a pitch, such that the pitch measured in said second direction changes continuously in said first direction from said first side wall to said second side wall;

an optical waveguide layer provided on said diffraction grating pattern in each of said mesa structures;

an active layer provided on said optical waveguide layer in each of said mesa structures;

a cladding layer provided on said active layer in each of said mesa structures;

first electrode means provided on said cladding layer in each of said mesa structures for injecting first type carriers having a first polarity;

second electrode means provided on said substrate for injecting second type carriers having a second polarity;

each of said grooves that forms said diffraction grating pattern in each of said plurality of mesa structures being aligned with a corresponding groove on an adjacent mesa structure on an imaginary line extending generally in said first direction across said plurality of mesa structures, such that a plurality of said imaginary lines are repeated in said second direction with a pitch that changes continuously in said first direction.

According to the present invention, it becomes possible to provide a laser diode array in each of which DFB laser diodes of different oscillation wavelengths are monolithically integrated by changing the diffraction grating pitch in each of the laser diodes.

Another object of the present invention is to provide an optical semiconductor device, comprising:

a semiconductor substrate having a first conductivity type and extending in first and second directions;

a plurality of mesa regions each provided on said semiconductor substrate so as to extend in said second direction, each of said mesa regions being defined by first and second side walls and repeated in said second direction;

a diffraction grating pattern provided in each of said mesa regions, said diffraction grating pattern including a plurality of grooves each extending generally in said first direction and repeated in said second direction with a pitch, such that the pitch measured in said second direction changes continuously in said second direction along said mesa structure;

an optical waveguide layer provided on said diffraction grating pattern in each of said mesa structures;

an active layer provided on said optical waveguide layer in each of said mesa structures;

a cladding layer provided on said active layer in each of said mesa structures;

first electrode means provided on said cladding layer in each of said mesa structures for injecting first type carriers having a first polarity;

second electrode means provided on said substrate for injecting second type carriers having a second polarity;

each of said grooves that forms said diffraction grating pattern in each of said plurality of mesa structures being aligned with a corresponding groove on an adjacent mesa structure on an imaginary line extending generally in said first direction across said plurality of mesa structures, such that a plurality of said imaginary lines are repeated in said second direction with a pitch that changes continuously in said second direction.

By dividing the optical semiconductor device of the present invention along cleaving lines in said first and second directions, it becomes possible to provide a number of DFB laser diodes having different oscillation wavelengths simultaneously.

Another object of the present invention is to provide a method of forming a diffraction grating pattern, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line parallel to a principal surface of said substrate;

said irradiating step further including a step of refracting said first and second optical beams by an optical element disposed in optical paths of said first and second optical beams, said optical element having a smooth surface inclined with respect to a plane parallel to said principal surface of said substrate in a first direction parallel to a direction of said intersection line and further inclined with respect to said plane in a second direction perpendicular to said first direction.

According to the present invention, it becomes possible to form a diffraction grating pattern on a single substrate such that the grating pitch as measured in the second direction changes continuously along the grooves extending in the first direction and forming the diffraction grating pattern.

Another object of the present invention is to provide a method of fabricating an optical semiconductor device, comprising the steps of:

irradiating a substrate by a first optical beam and a second optical beam, with respective, mutually different incident angles, such that said first and second optical beams form interference fringes on said substrate;

exposing a resist film provided on said substrate by said interference fringes to form a resist pattern; and forming a diffraction grating pattern on said substrate in accordance with said interference fringes by using said resist pattern as a mask;

said first and second optical beams being irradiated, in said irradiating step, such that a wavefront of said first optical beam and a wavefront of said second optical beam intersect at an intersection line extending in a first direction parallel to a principal surface of said substrate;

said irradiating step further including a step of refracting said first and second optical beams by an optical element disposed in optical paths of said first and second optical beams, said optical element having a smooth surface inclined with respect to said principal surface of said substrate in a second direction perpendicular to said first direction.

According to the present invention, it becomes possible to form a diffraction grating pattern on a substrate such that the grating pitch as measured in the second direction changes continuously in the second direction.

Other objects and further features of the present invention will become apparent from the following detailed description when read in conjunction with the attached drawings.

BRIEF DESCRIPTION OF THE PREFERRED EMBODIMENTS

DETAILED DESCRIPTION OF THE PREFERRED EMBODIMENTS

Principle

Figure 6A:
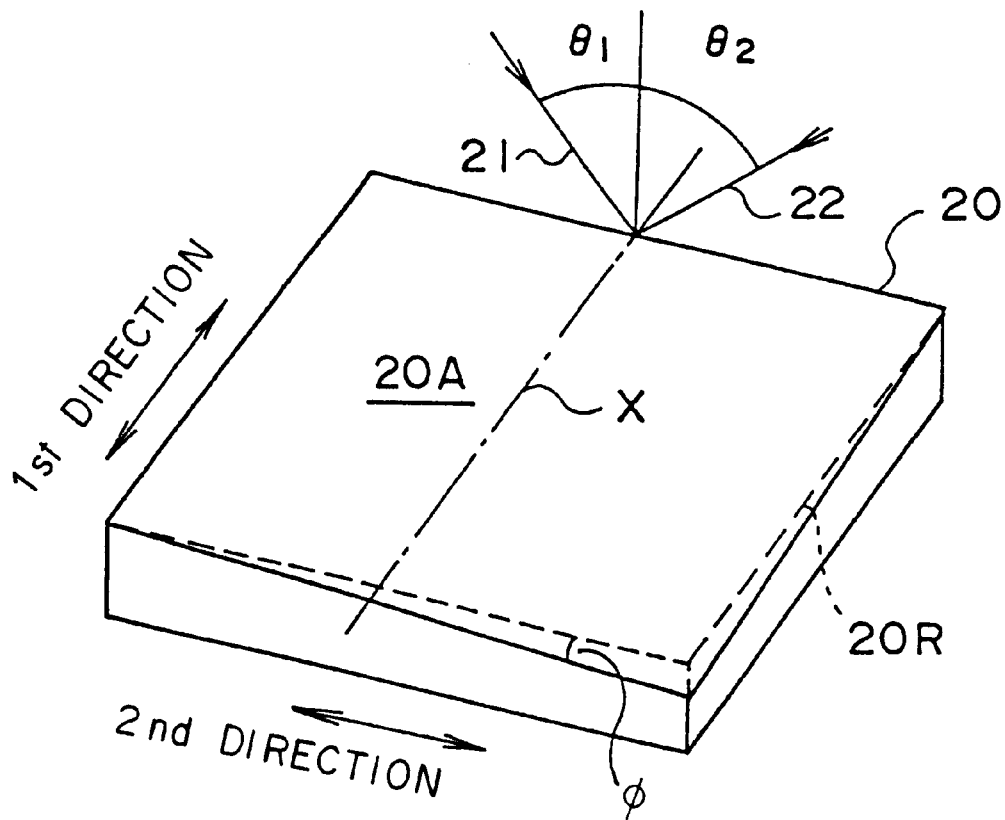
FIGS. 6A and 6B are diagrams showing the principle of the present invention.
Figure 6B:
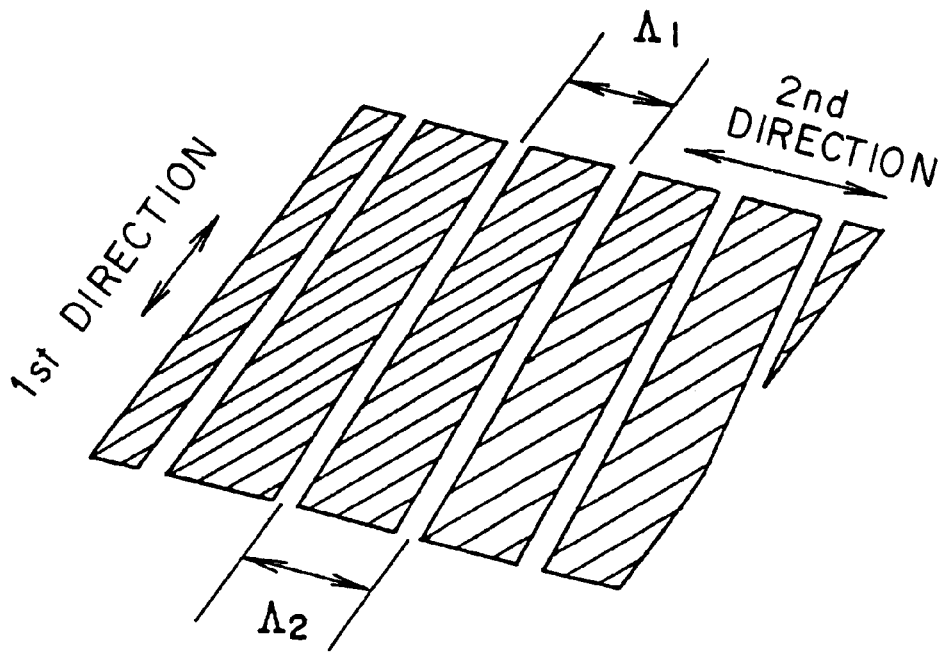

FIGS. 6A and 6B are diagrams showing the principle of the present invention.

Figure 3:
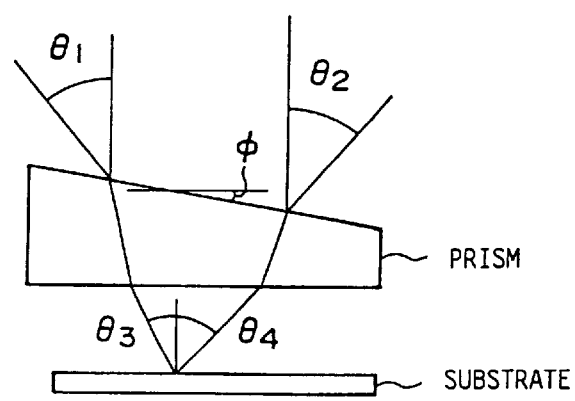
FIG. 3 is a diagram showing the principle of modifying a grating pitch used in the conventional exposure process of FIG. 2.

Referring to FIG. 6A, the present invention uses a prism 20 having a curved sloped surface 20A in the exposure process of FIG. 3, wherein the curved sloped surface 20A of the prism 20 inclines in a first direction and further in a second, perpendicular direction with respect to an imaginary reference plane 20R that is parallel to the principal surface of the substrate to be exposed.

In the exposure process, the prism 20 is disposed in the optical paths of first and second optical beams 21 and 22, such that the optical beams 21 and 22 impinge upon the prism 20 with respective incident angles $\Theta_1$ and $\Theta_2$ with respect to the foregoing reference plane 20R, in a state that a wavefront of the optical beam 21 and a wavefront of the optical beam 22 intersect each other at an intersection line X that extends parallel to the foregoing reference plane 20R. It should be noted that the reference plane 20R is parallel to the bottom surface of the prism 20. In the example of FIG. 6A, the reference plane 20R is also parallel to the principal surface of the substrate to be exposed, although this is not a mandatory requirement. The curved sloped surface 20A is inclined in the second direction with respect to the foregoing reference plane 20R with an angle $\phi$, which is typically set to about 7.5°.

FIG. 6B shows an example of the interference fringe pattern formed on the substrate for the case in which the prism 20 is disposed in the optical paths of the optical beams 21 and 22.

Referring to FIG. 6B, the interference fringe pattern includes a number of fringes extending in the first direction and repeated in the second direction, wherein it should be noted that the repetition pitch of the fringes changes gradually from a first pitch $\Lambda_1$ to a second pitch $\Lambda_2$ in the first direction or in the elongating direction of the fringes.

Thus, by providing a photoresist on the substrate surface, the photoresist is exposed according to the interference fringe pattern of FIG. 6B, and it becomes possible to form a diffraction grating pattern on the substrate in correspondence to the interference fringe pattern of FIG. 6B by conducting an etching of the substrate while using a resist pattern thus obtained as a mask. By forming a number of DFB laser diodes or DBR laser diodes, each extending in the second direction on such a diffraction grating pattern such that the laser diodes are repeated in the first direction, it becomes possible to form a laser diode array in which a number of laser diodes, each having an oscillation wavelength different from the oscillation wavelength of other laser diodes, are integrated on a common substrate monolithically.

Figure 4:
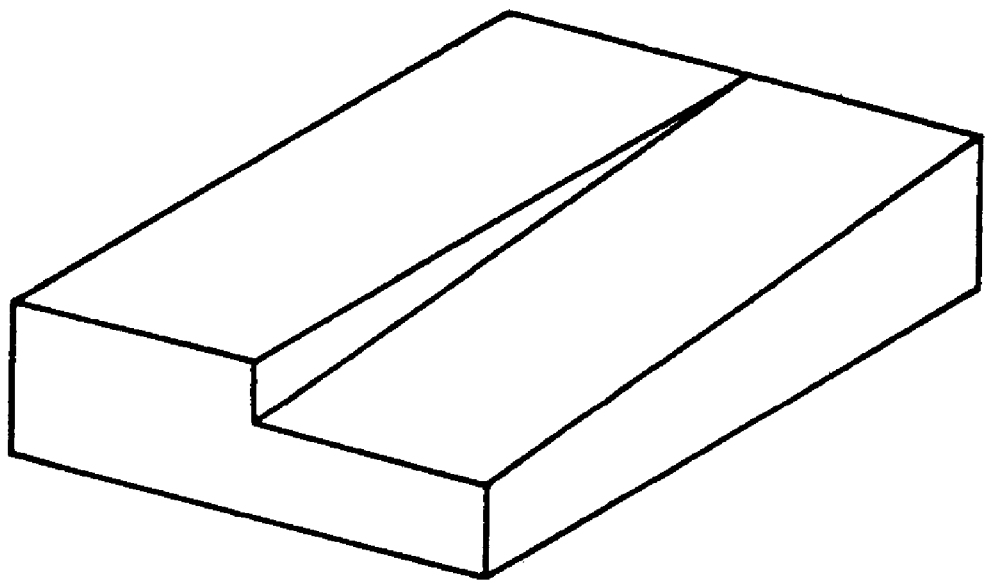
FIG. 4 is a diagram showing a prism proposed conventionally for forming a diffraction grating pattern on a substrate with different grating pitches.
Figure 5A:
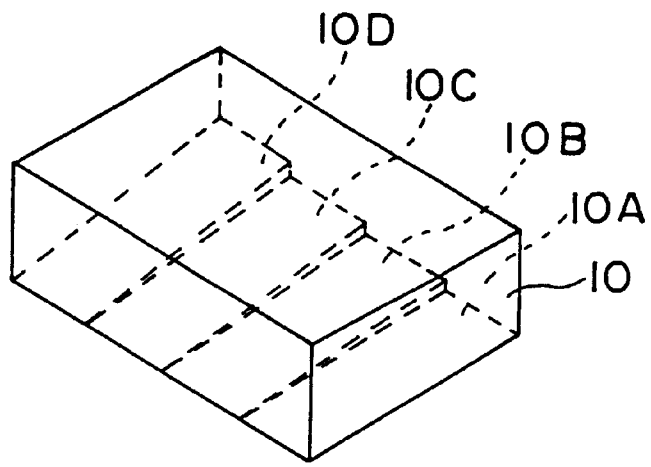
FIGS. 5A and 5B show respectively another conventional prism for forming a diffraction grating pattern on a substrate with different grating pitches and an expected diffraction pattern for a hypothetical, ideal case.
Figure 5B:
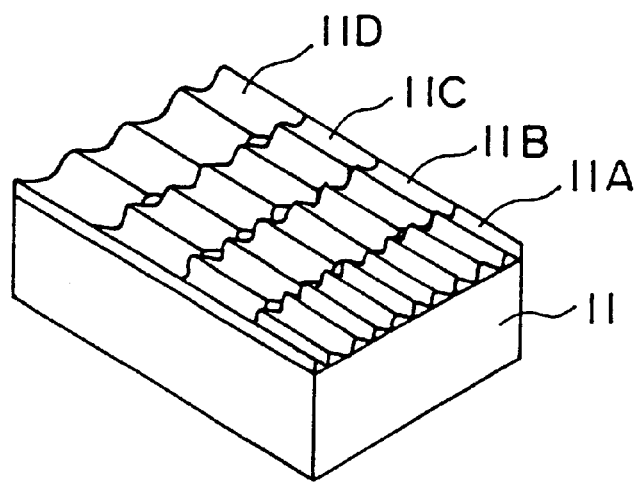

In the prism 20 of FIG. 6A, it should be noted that the shape of the curved sloped surface 20A can be obtained in terms of the inclination angle φ and the change of the angle φ in the second direction, by using the equation explained previously with reference to FIG. 3. As the prism 20 is free from the steps contrary to the prism of FIG. 4 or FIG. 5A, the exposed interference fringe pattern is inherently free from the distortion causes by the diffraction. Further, the prism 20 is easily manufactured as compared with the case of the prism of FIG. 5A in which a number of minute surfaces have to be formed.

Figure 7A:
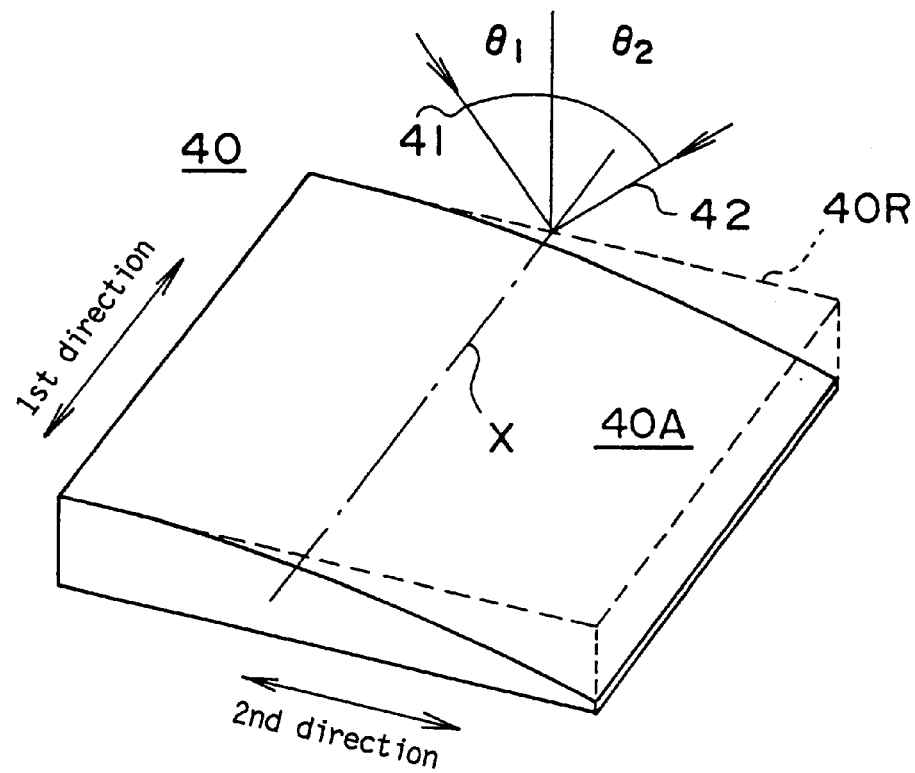
FIGS. 7A and 7B are further diagrams showing the principle of the present invention.
Figure 7B:
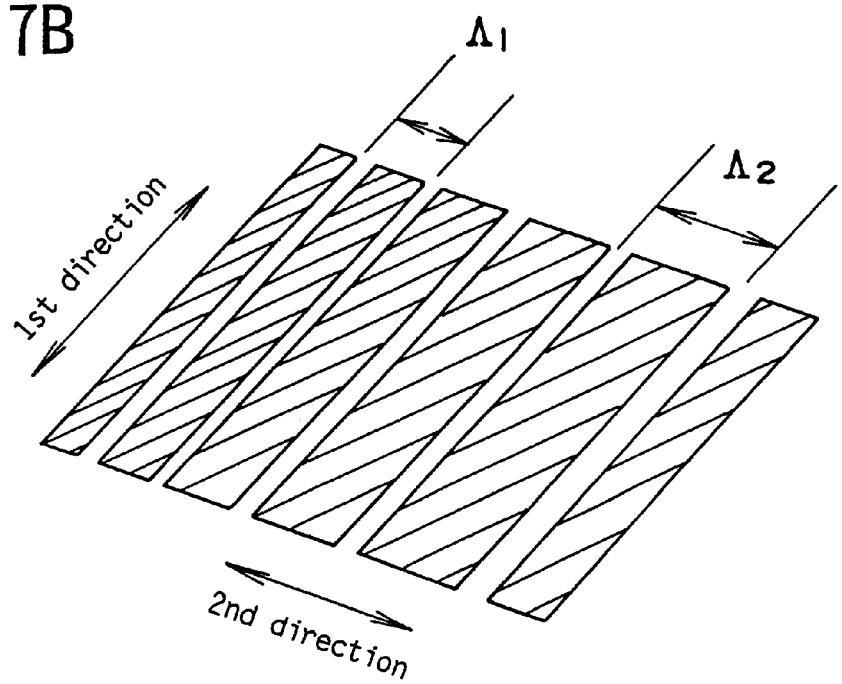

FIGS. 7A and 7B show another aspect of the present invention.

More specifically, FIG. 7A shows a prism 40 used in the exposure process of FIG. 3, wherein it should be noted that the prism 40 has an inclined curved surface 40A that increases the inclination angle continuously in the second direction. The prism 40 is disposed in the optical paths of the optical beams 41 and 42 such that the optical beams 41 and 42 impinge upon the prism 40 with respective incident angles $\Theta_1$ and $\Theta_2$ and such that the intersection line X, at which a wavefront of the optical beam 41 and a wavefront of the optical beam 42 intersect with each other, extends in the first direction in a reference plane 40 parallel to the bottom surface of the prism 40.

FIG. 7B shows an example of the optical interference fringe pattern thus formed by the prism 40.

Referring to FIG. 7B, each of the interference fringes forming the optical interference fringe pattern extends parallel in the first direction and is repeated in the second direction, wherein the pitch of repetition is increased continuously from $\underline{\Delta}$ to $\underline{\Delta}_2$ in the second direction. Thus, by providing a photoresist on the substrate surface, the photoresist is exposed according to the interference fringe pattern of FIG. 7B, and it becomes possible to form a diffraction grating pattern on the substrate in correspondence to the interference fringe pattern of FIG. 7B by conducting an etching of the substrate while using a resist pattern thus obtained as a mask. In the prism 40 of FIG. 7A, it should be noted that the shape of the curved surface 40A can be obtained in terms of the inclination angle φ and the change of the angle φ in the second direction, by using the equation explained previously with reference to FIG. 3.

Figure 8A:
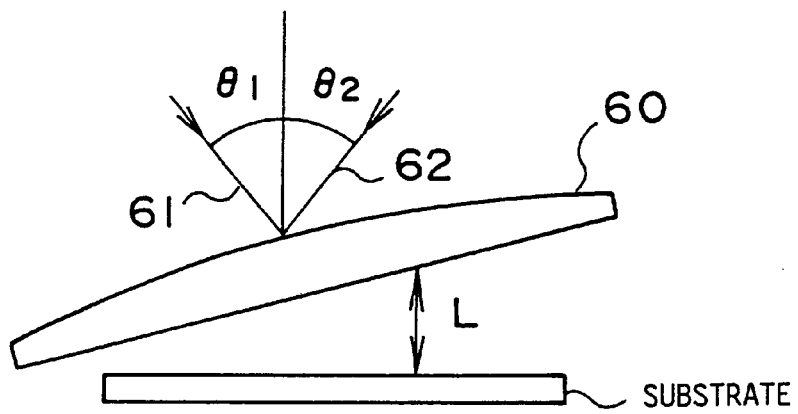
FIG. 8A is a further diagram showing the principle of the present invention.

FIG. 8A shows a further principle of the present invention that uses a lens 60 in place of prism in the exposure process of FIG. 3.

Referring to FIG. 8A, the lens 60 is a plano-convex lens having a focal length F, wherein the lens 60 is disposed obliquely on the substrate such that optical beams 61 and 62 hit the lens 60 with respective incident angles $\Theta_1$ and $\Theta_2$. Thereby, the optical interference fringe pattern thus exposed on the substrate by the optical beams 61 and 62 through the lens 60 has a pitch $\underline{\Delta}_3$ that is given by the relationship of $$\underline{\Delta}_3 = \underline{\Delta}_2 (F-L)/F$$

where $\underline{\Delta}_2$ is defined already and L represents the distance between the substrate and the lens 60.

Figure 8B:
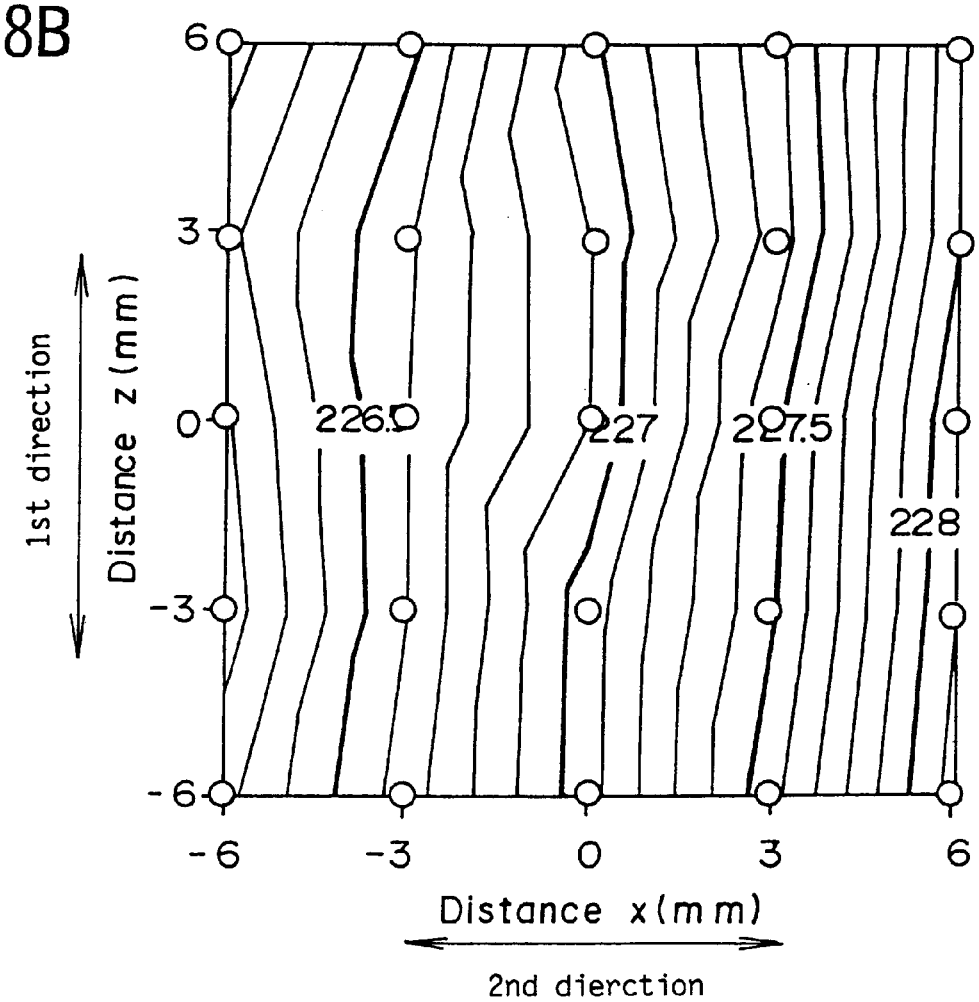
FIG. 8B is a diagram showing an example of a measured diffraction pattern formed according to the process of FIG. 8A.

FIG. 8B shows a measured interference fringe pattern for the case in which a laser beam produced by a He-Cd laser with a wavelength of 325 nm is used for the optical beams 61 and 62. In the measurement, the aperture of the lens was set to 80 mm and the focal length F was set to 580 mm. Further, the incident angles $\Theta_1$ and $\Theta_2$ were both set to 42.2°, and the lens 60 was tilted with respect to the substrate by 30°.

Referring to FIG. 8B, the pitch of the interference fringe patterns exposed on the substrate changes not only in the second direction but also in the first direction.

Figure 9:
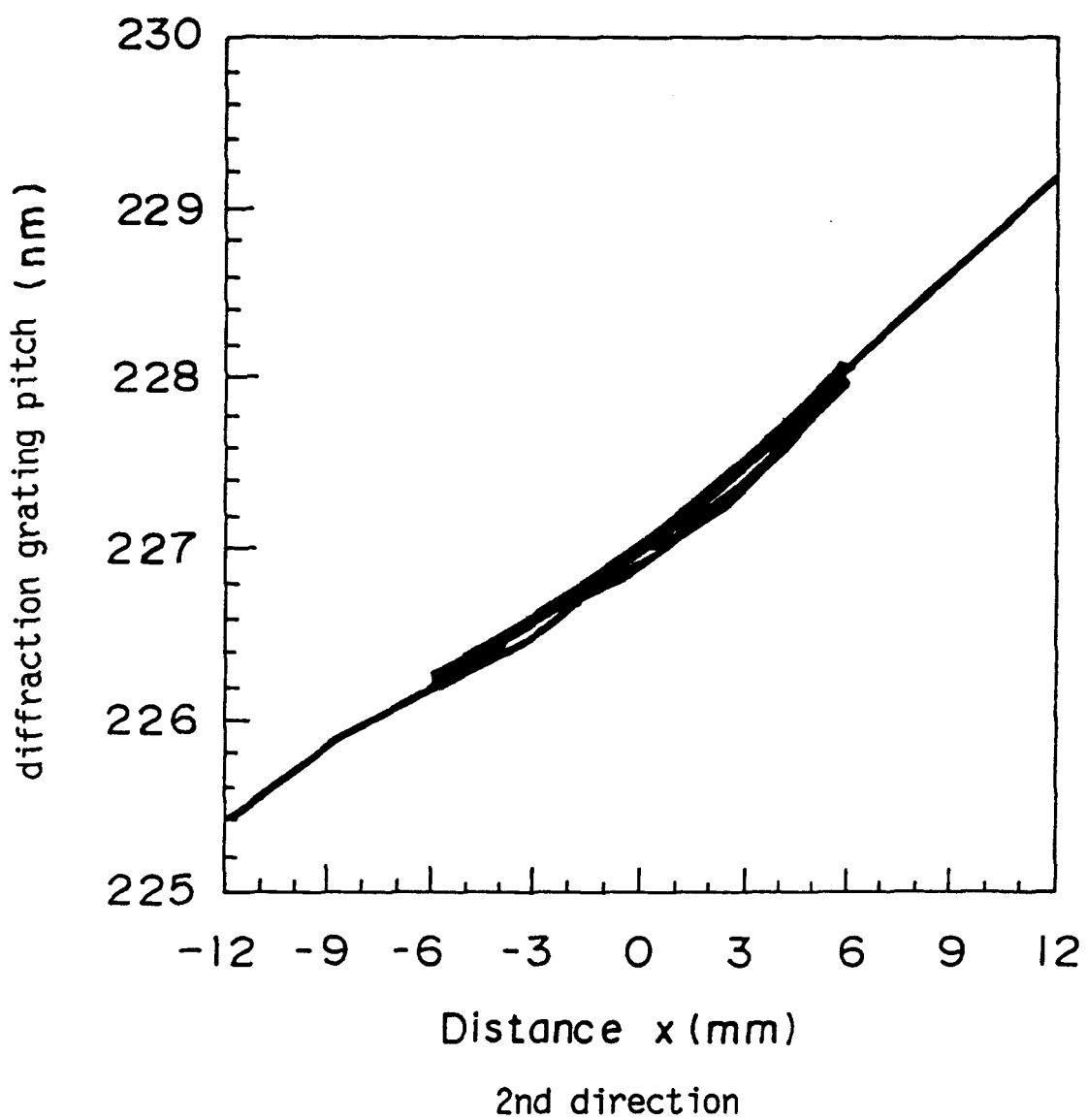
FIG. 9 is a another diagram showing an example of a measured diffraction pattern formed according to the process of FIG. 8A.

FIG. 9 shows the change of the diffraction grating pitch thus measured in the second direction.

Referring to FIG. 9, it will be noted that the grating pitch in the second direction increases continuously in the second direction. Further, FIG. 9 indicates that the change of the grating pitch in the first direction is small as indicated by the overlapping of the lines.

First Embodiment

FIGS. 10A–10I are diagrams showing the fabrication process of a laser diode array according to a first embodiment of the present invention.

Figure 10A:
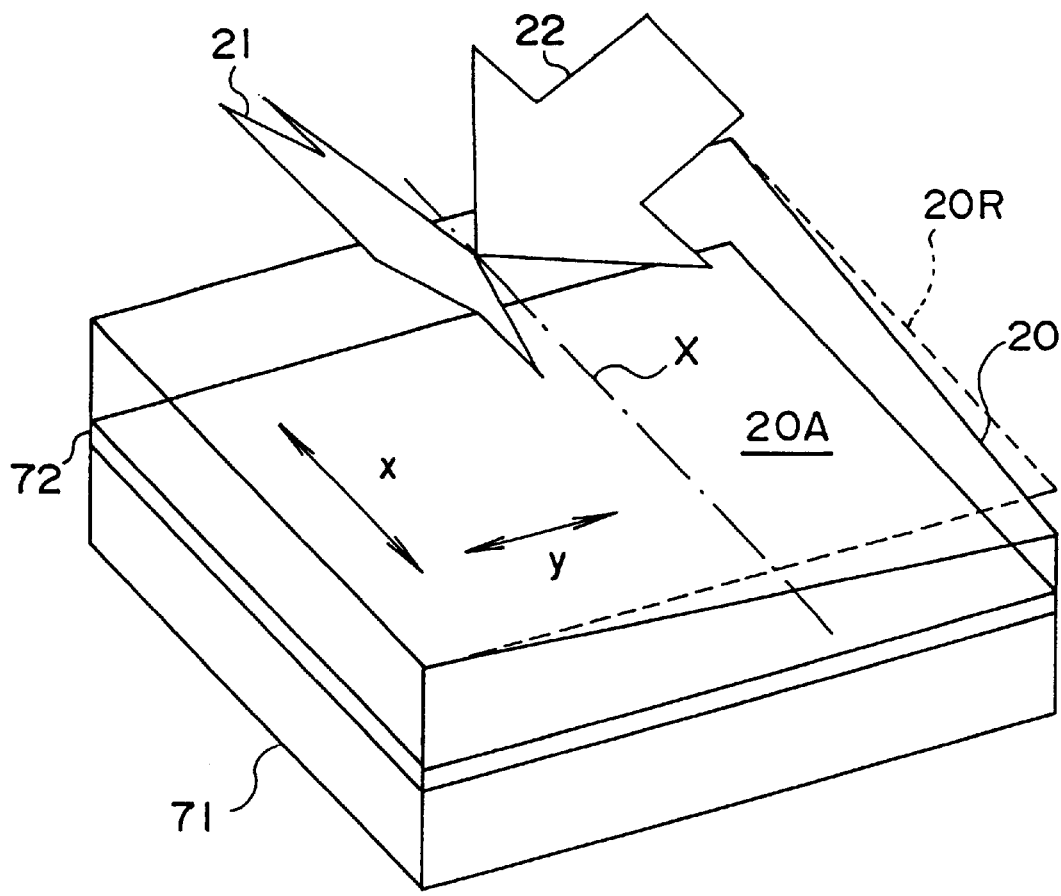
FIGS. 10A–10I are diagrams showing the fabrication process of a laser diode array according to a first embodiment of the present invention.
Figure 10B:
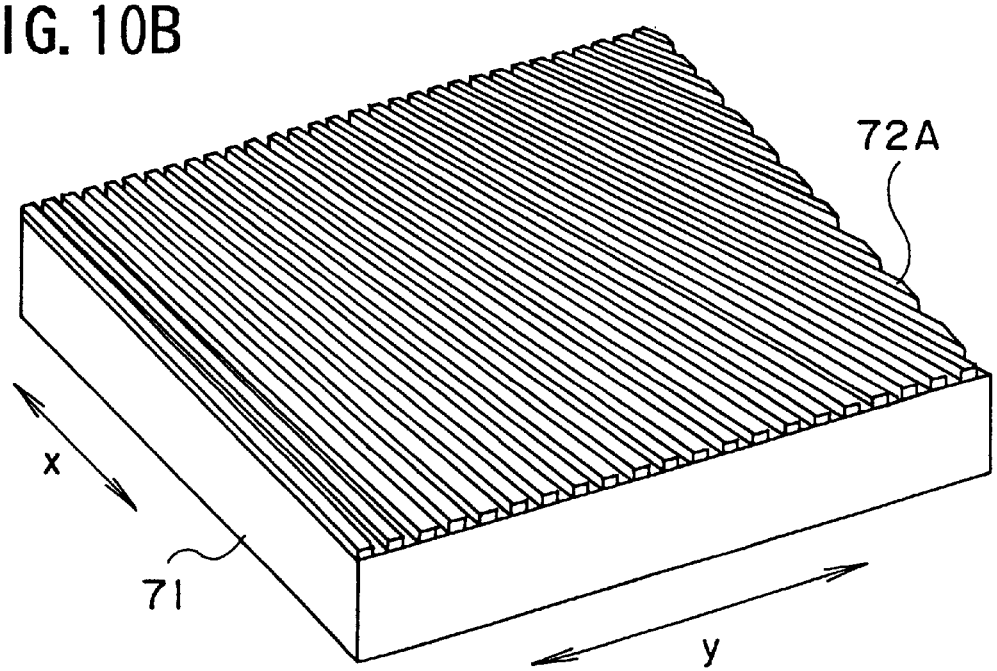

Referring to FIG. 10A, a resist film 72 is spin-coated on an n-type InP substrate 71, and the InP substrate 71 thus spin-coated with the resist film 72 is subjected to an exposure process, in which the resist film 72 is exposed by an interference fringe pattern formed as a result of interference of the optical beams 21 and 22, both produced by a He-Cd laser with a wavelength of 325 nm.

As explained already, the optical beams 21 and 22 are irradiated such that the intersection line X of the wavefront of the beam 21 and the wavefront of the beam 22 extends parallel to the surface of the substrate 71 to be exposed. In the illustrated example, the intersection line X extends in an x-direction, and the resist film 72 is exposed by the interference fringe pattern formed of a number of fringes each extending in the x-direction.

In the exposure process, the present embodiment uses the prism 20 that has the curved sloped surface 20A as indicated in FIG. 10A such that the optical beams 21 and 22 hit the prism 20 similarly to FIG. 6A. Thereby, a resist pattern 72A is obtained after exposure and development of the resist film 72, wherein it should be noted that the resist pattern 72A includes a number of grooves extending generally in the x-direction and repeated in the y-direction. Thereby, the grating pitch as measured in the y-direction changes along grooves in the x-direction.

Figure 10C:
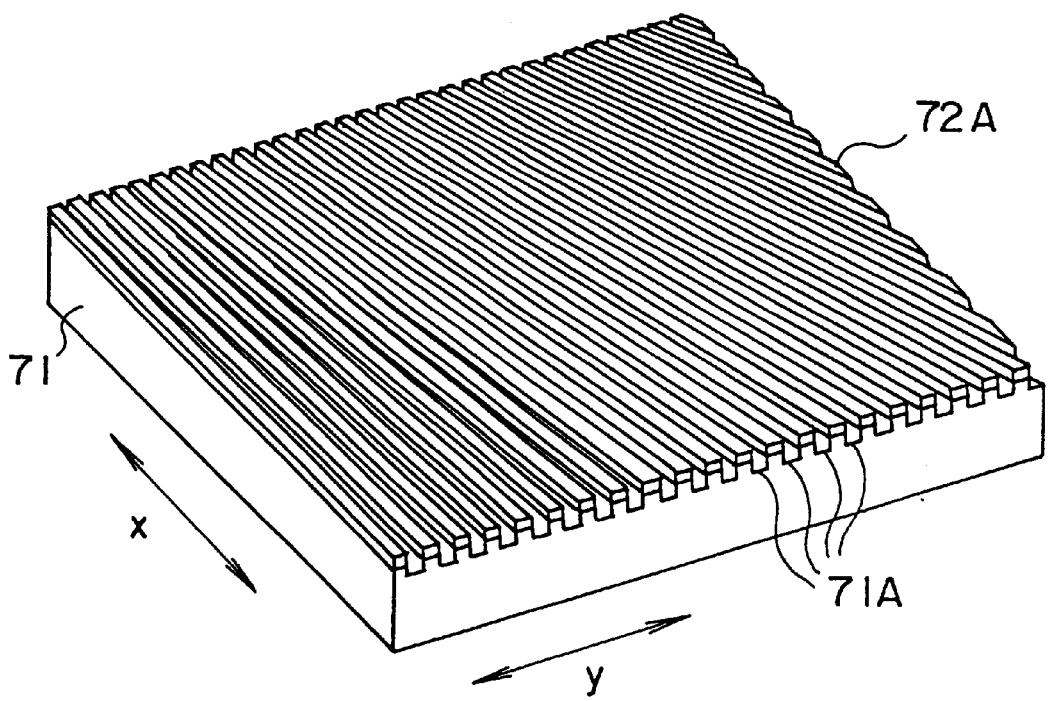

Next, in the step of FIG. 10C, the InP substrate 71 is subjected to a wet etching process while using the resist pattern 72A as a mask, and a number of grooves 71A corresponding to the foregoing resist mask 72A are formed on the surface of the substrate 71, typically with a thickness of about 30 nm.

Figure 10D:
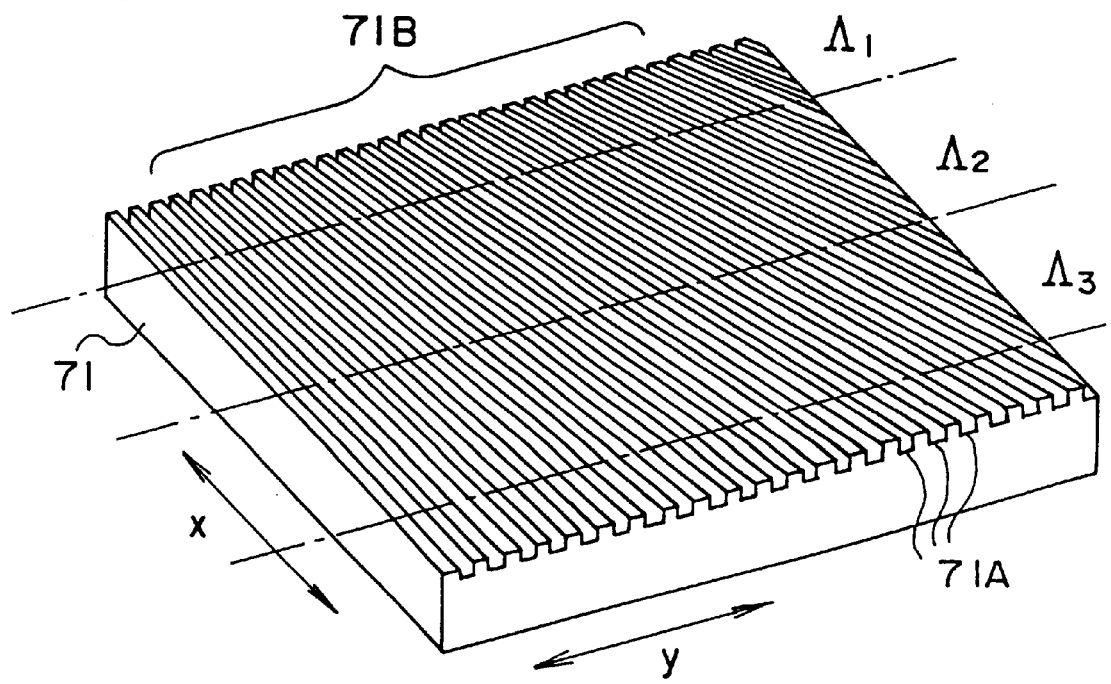

Next, the resist mask 72A is removed, and a structure shown in FIG. 10D is obtained in which it should be noted that a diffraction grating pattern 71B is formed on the surface of the substrate 71 in the form of the foregoing grooves 71A. In FIG. 10D, the grating pitch of the diffraction grating 71B as measured in the y-direction takes different values $\underline{\Delta}_1$, $\underline{\Delta}_2$ and $\underline{\Delta}_3$ ($\underline{\Delta}_1 < \underline{\Delta}_2 < \underline{\Delta}_3$) along various longitudinal cross-sections indicated in the drawing by one-dotted lines.

Figure 10E:
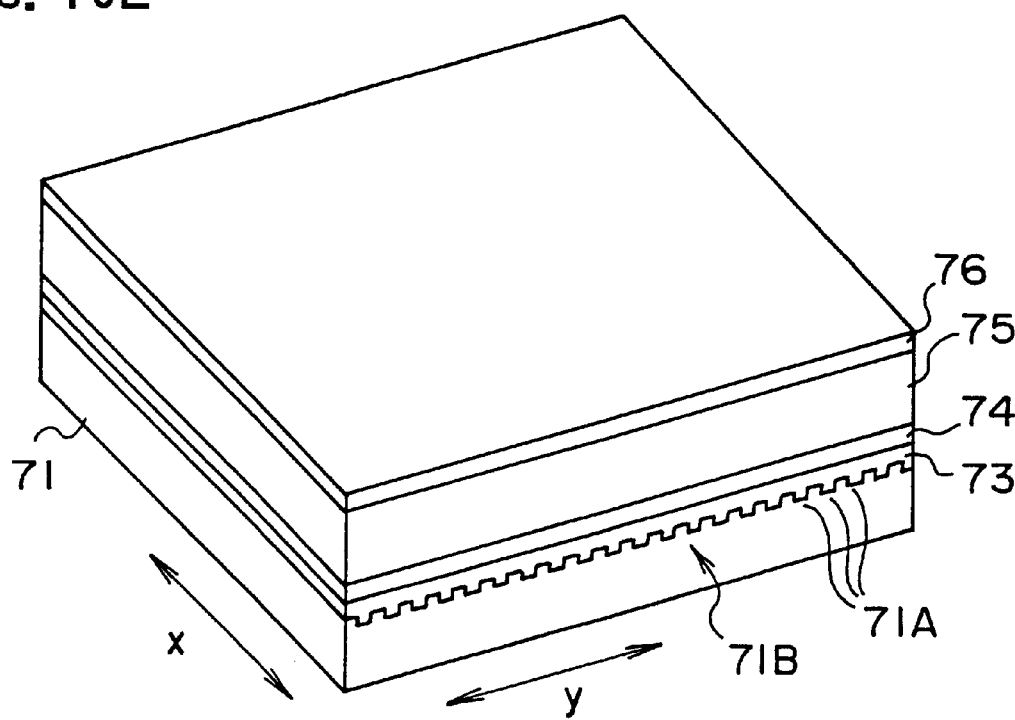

Next, in the step of FIG. 10E, an optical waveguide layer of n-type InGaAsP is provided on the substrate 71 by an MBE process or MOVPE process typically with a thickness of 150 nm, and an active layer 74 having an MQW structure is formed on the optical waveguide layer 73 thus formed by epitaxially growing a barrier layer of undoped InGaAsP and a quantum layer of InGaAs alternately and repeatedly. In a typical example, the barrier layer has a thickness of about 10 nm and the quantum well layer has a thickness of about 6 nm, and the quantum structure thus formed is stacked for about ten times. As a result of the confinement of the carriers, quantum levels appears in the active layer 74 together with associated quantized carrier state density, as is well known in the art.

On the active layer 74, a cladding layer of p-type InGaAsP is provided, on which a contact layer 76 of p$^+$-type is provided further.

Figure 10F:
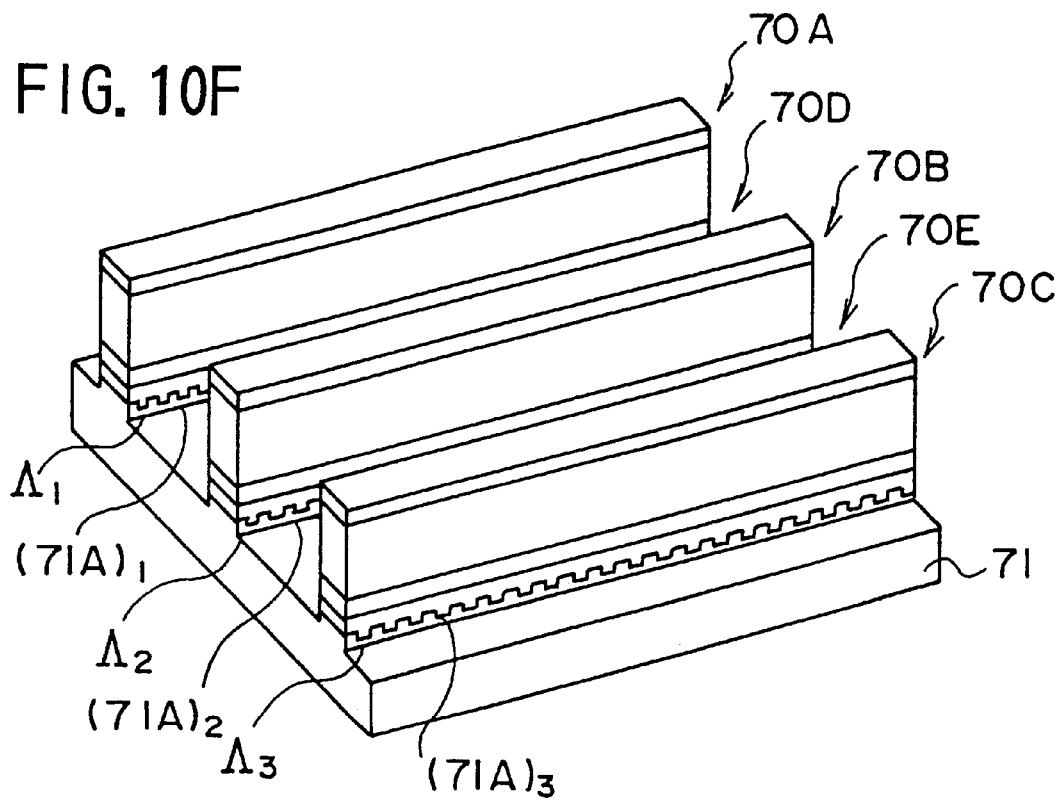

Next, in the step of FIG. 10F, the structure of FIG. 10E is subjected to a mesa-etching process such that mesas 70A, 70B and 70C each extending in the y-direction are formed on the substrate 71 integrally, with intervening device isolation grooves 70D and 70E. It should be noted that each of the isolation grooves 70D and 70E reaches a level below the bottom of the grooves 71A forming the diffraction grating pattern 71B, and thus, the isolation grooves 70D and 70D divides the diffraction grating pattern 71B into a diffraction grating (71A)$_1$ formed on the mesa 70A with the pitch $\underline{\Lambda}_1$ and extending in the y-direction, a diffraction grating (71A)$_2$ formed on the mesa 70B with the pitch $\underline{\Lambda}_2$ and extending in the y-direction, and a diffraction grating (71A)$_3$ formed on the mesa 70C with the pitch $\underline{\Lambda}_3$ and extending in the y-direction.

Figure 10G:
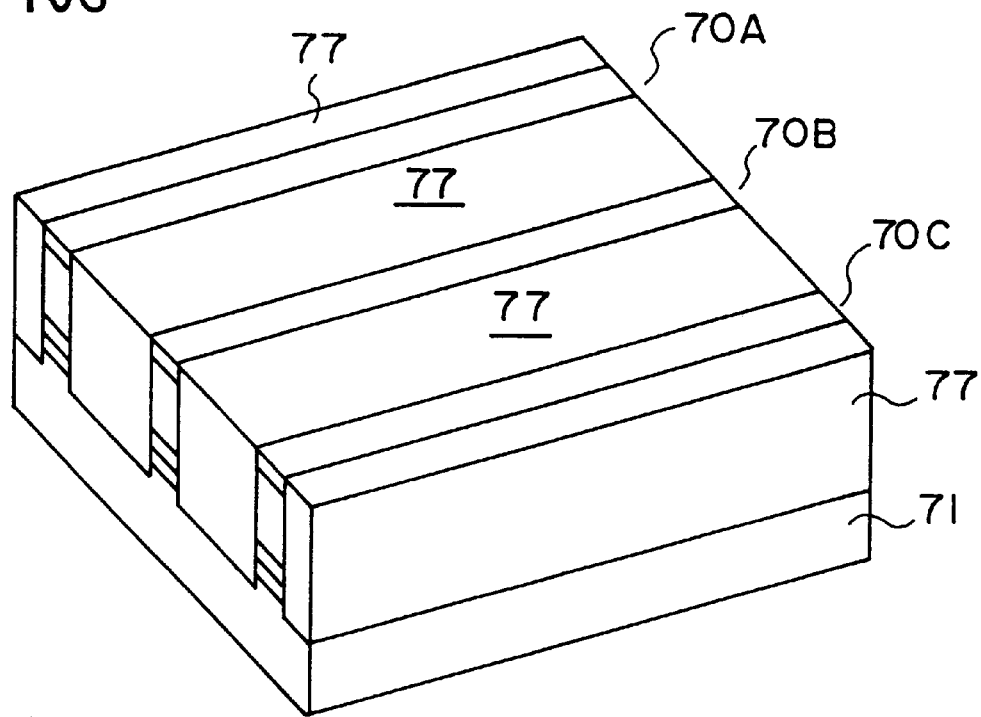

Next, in the step of FIG. 10G, the foregoing isolation grooves 70D and 70E are filled by an InP layer doped by a deep impurity element such as Fe, and a current confinement structure 77 of high resistance is formed by the InP layer thus filling the grooves 70D and 70E.

Figure 10H:
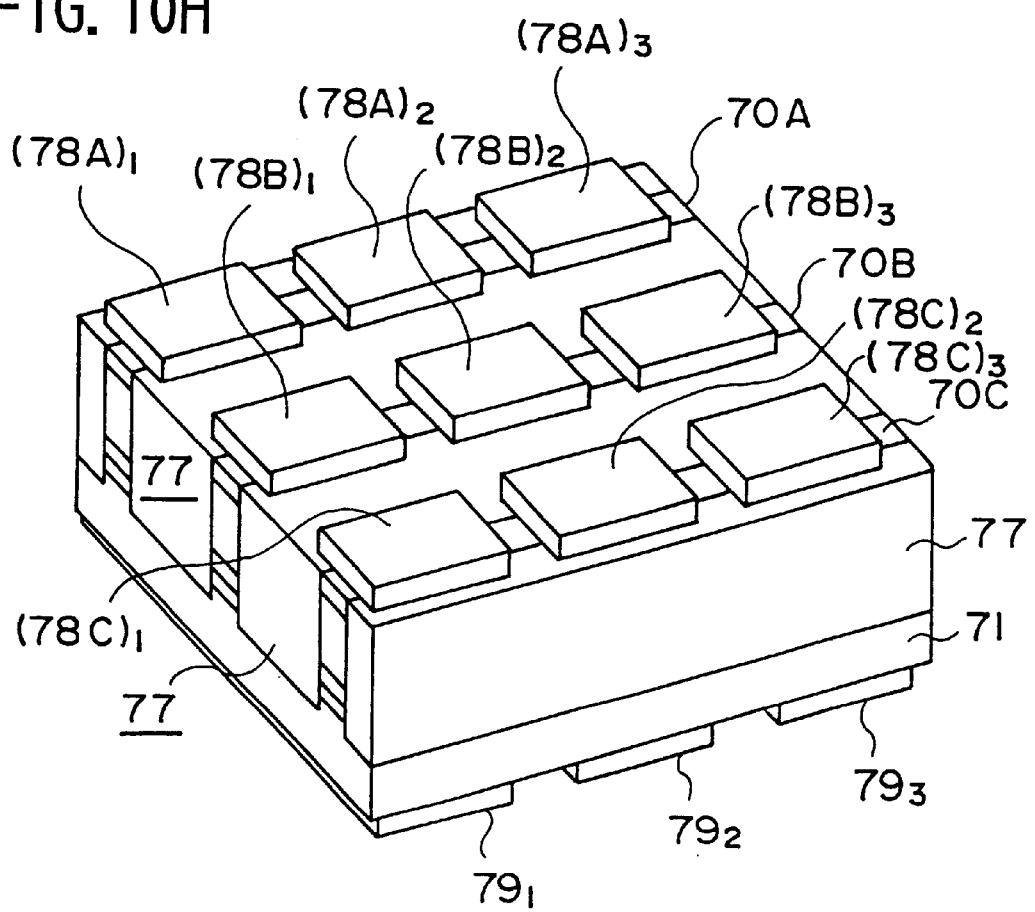

Next, in the step of FIG. 10H, upper ohmic electrodes (78A)$_1$, (78A)$_2$ and (78A)$_3$ are formed on the mesa 70A along the longitudinal or elongating direction thereof. Similarly, ohmic electrodes (78B)$_1$, (78B)$_2$ and (78B)$_3$ are formed on the mesa 70B along the elongating direction of the mesa 70B, and ohmic electrodes (78C)$_1$, (78C)$_2$ and (78C)$_3$ are formed on the mesa 70C along the elongating direction of the mesa 70C.

In the structure of FIG. 10H, it should be noted that a lower ohmic electrode 79$_1$ is provided on the lower major surface of the substrate 71 in correspondence to the upper ohmic electrodes (78A)$_1$, (78B)$_1$ and (78C)$_1$, such that the ohmic electrode 79$_1$ extends in the direction perpendicular to the elongating direction of the mesa 70A and hence the elongating direction of the mesa 70B or 70C. Similarly, a lower ohmic electrode 79$_2$ is provided on the lower major surface of the substrate 71 in correspondence to the upper ohmic electrodes (78A)$_2$, (78B)$_2$ and (78C)$_2$, such that the ohmic electrode 79$_2$ extends parallel to the electrode 79$_1$. Further, a lower ohmic electrode 79$_3$ is provided on the lower major surface of the substrate 71 in correspondence to the upper ohmic electrodes (78A)$_3$, (78B)$_3$ and (78C)$_3$, such that the ohmic electrode 79$_3$ extends parallel to the electrode 79$_2$.

Figure 10I:
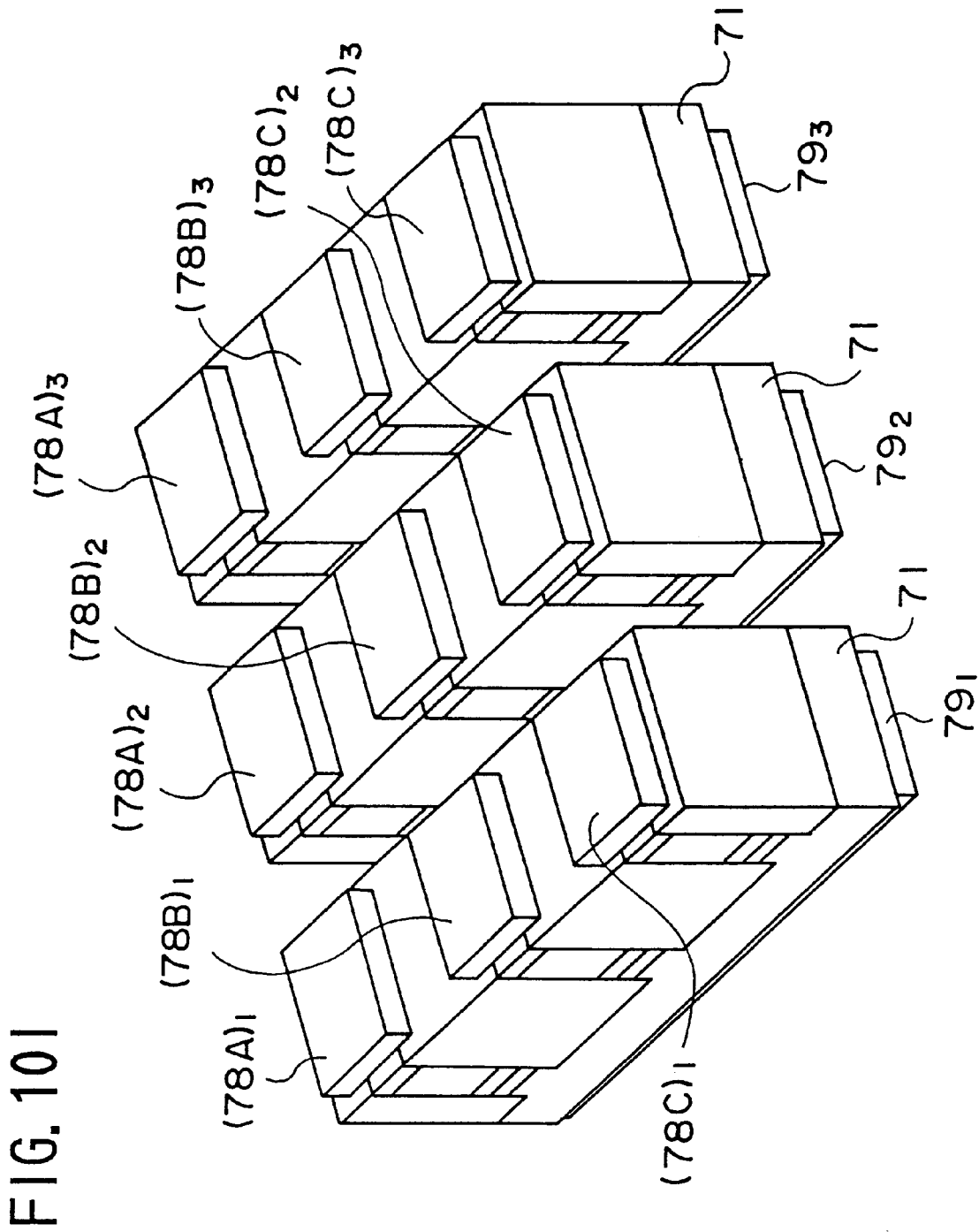

Thus, by cleaving the structure of FIG. 10H along the rows of the electrodes (78A)$_1$–(78C)$_1$, (78A)$_2$–(78C)$_2$ and (78A)$_3$–(78C)$_3$, it is possible to obtain three, mutually identical laser diode arrays as indicated in FIG. 10I, wherein it should be noted that each of the laser diode array includes therein three DFB laser diodes having respective grating pitches of $\underline{\Lambda}_1$, $\underline{\Lambda}_2$ and $\underline{\Lambda}_3$ and hence different oscillation wavelengths.

As explained previously, the present embodiment uses the prism 20 in the exposure process of the diffraction grating pattern. As the prism 20 has a continuous inclined surface as indicated in FIG. 6A, there is no difficulty in the manufacturing of the prism 20 or exposure of the diffraction grating pattern, even in the case where the separation between adjacent laser diode in the laser diode array is very small. Further, the prism 20 is free from a stepped structure on the surface, and the exposure process conducted by using the prism 20 is inherently free from the problem of distortion of the exposed diffraction grating pattern by the diffraction of the optical beam.

Figure 11A:
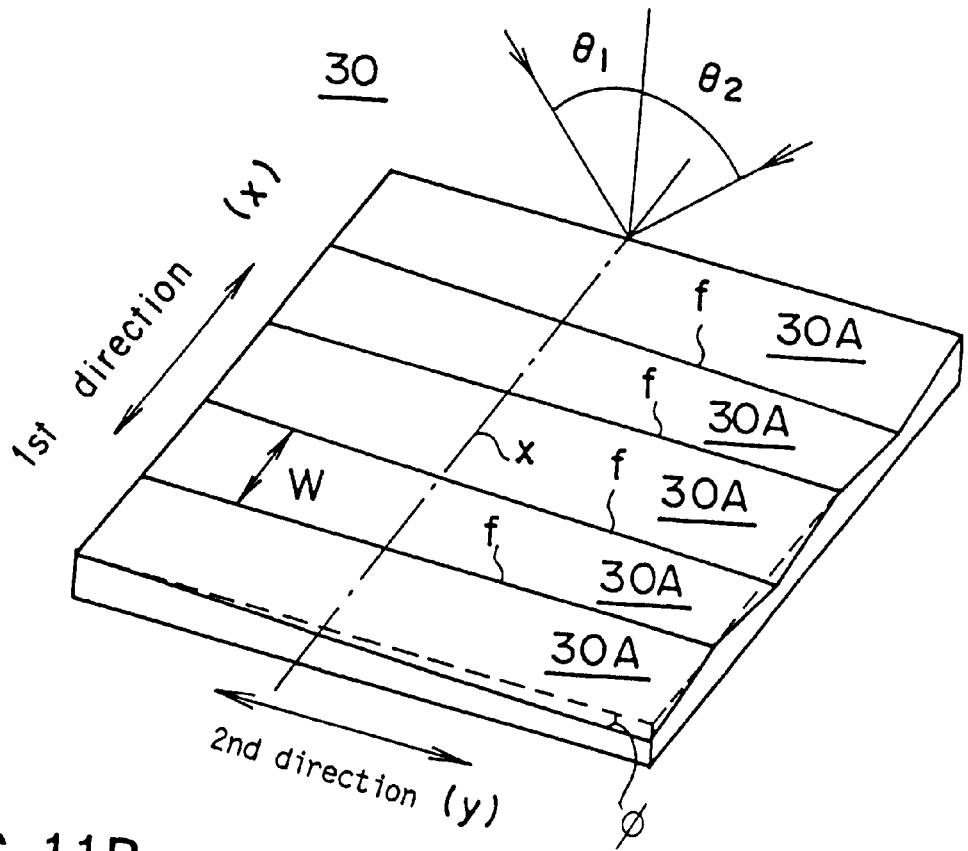
FIGS. 11A and 11B are diagrams showing a modification of the first embodiment.
Figure 11B:
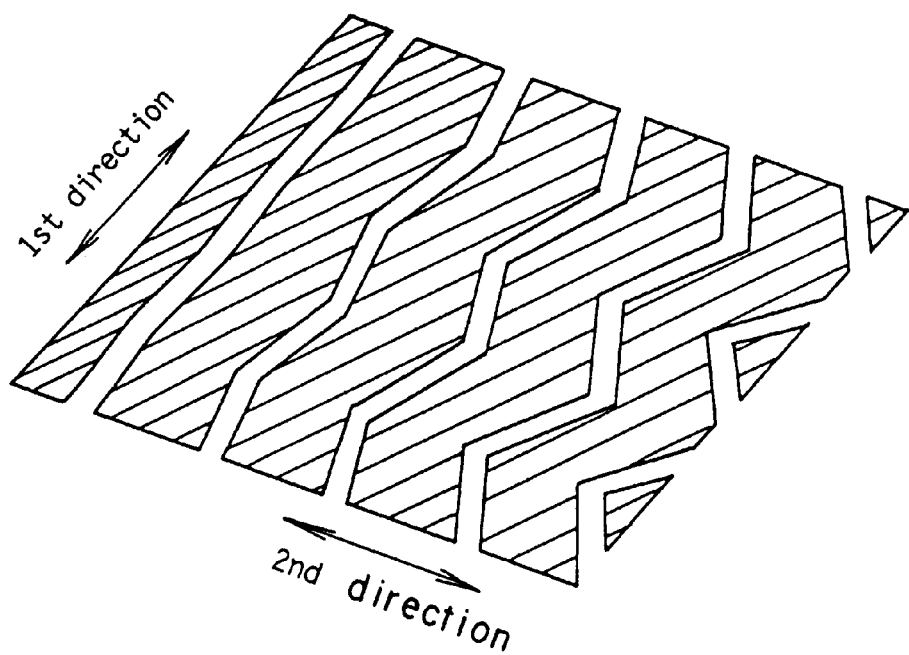

FIG. 11A shows the construction of a prism 30 according to a modification of the present embodiment. Further, FIG. 11B shows the exposed diffraction pattern formed by the prism 30.

Referring to FIG. 11A, the prism 30 is formed with a number of sloped surfaces 30, each corresponding to the curved sloped surface 20A of the prism 20, repeatedly in first or x-direction while changing the inclination angle alternately up and down. As a result, one of the sloped surface 30A continues to an adjacent sloped surface 30A at a creasing line f, without forming a step therebetween. By forming the curved sloped surfaces 30A repeatedly over the entire prism 30, it becomes possible to form the diffraction grating pattern shown in FIG. 11B over the entire surface of the substrate 71, which may be an InP wafer.

In the construction of FIG. 11A, it should be noted that the inclination angle $\phi$ of each curved sloped surface 30A in the foregoing second direction is typically set in a range between 8–12°. Further, each curved sloped surface 30A may have a width W of about 6 mm in the x-direction.

Second Embodiment

Next, a fabrication process of a laser diode according to a second embodiment of the present invention will be described with reference to FIGS. 12A–12J, wherein those parts corresponding to the parts described previously are designated by the same reference numerals and the description thereof will be omitted.

Figure 12A:
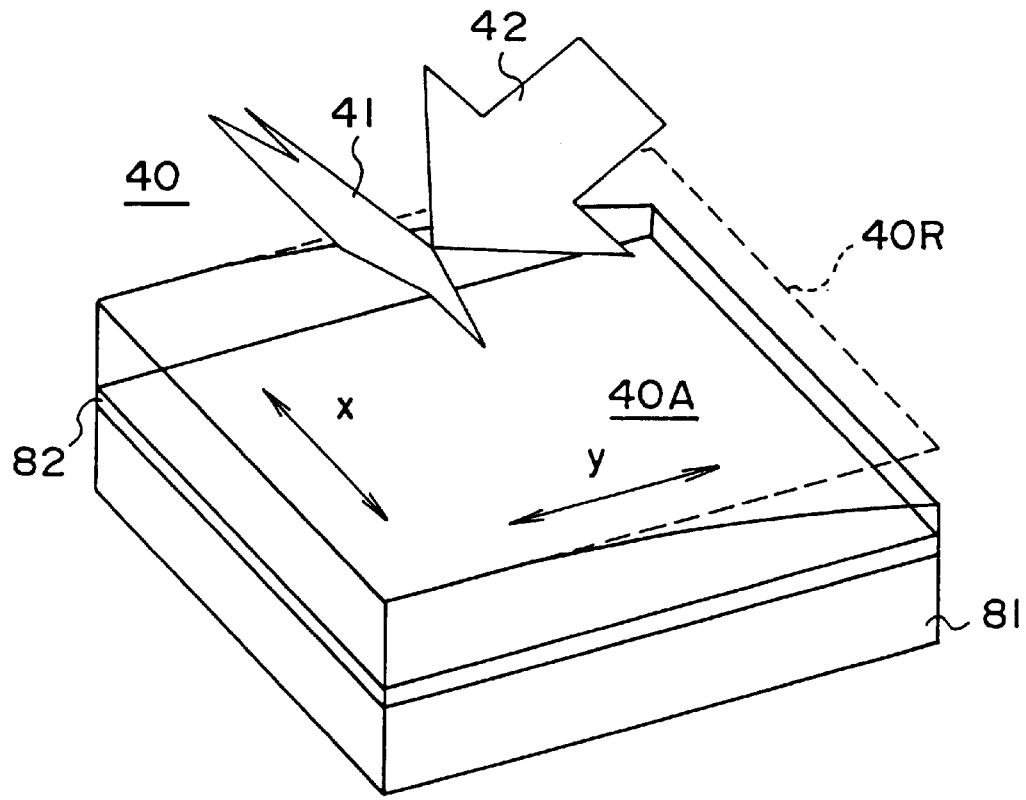
FIGS. 12A–12J are diagrams showing the fabrication process of DFB laser diodes according to a second embodiment of the present invention.

Referring to FIG. 12A, a resist film 82 provided on a substrate 81 of n-type GaAs is exposed with an interference fringe pattern formed as a result of interference of the coherent optical beams 41 and 42 each formed by a He-Cd laser with a wavelength of 325 nm. Similarly as before, the beams 41 and 42 are directed such that the intersection line X of the wavefronts of the respective optical beams extend parallel to the substrate surface. In the example of FIG. 12A, the intersection line X extends in the x-direction. As a result of the exposure, the resist film 82 is exposed with the interference fringe pattern including a number of parallel fringes each extending generally in the x-direction.

Figure 12B:
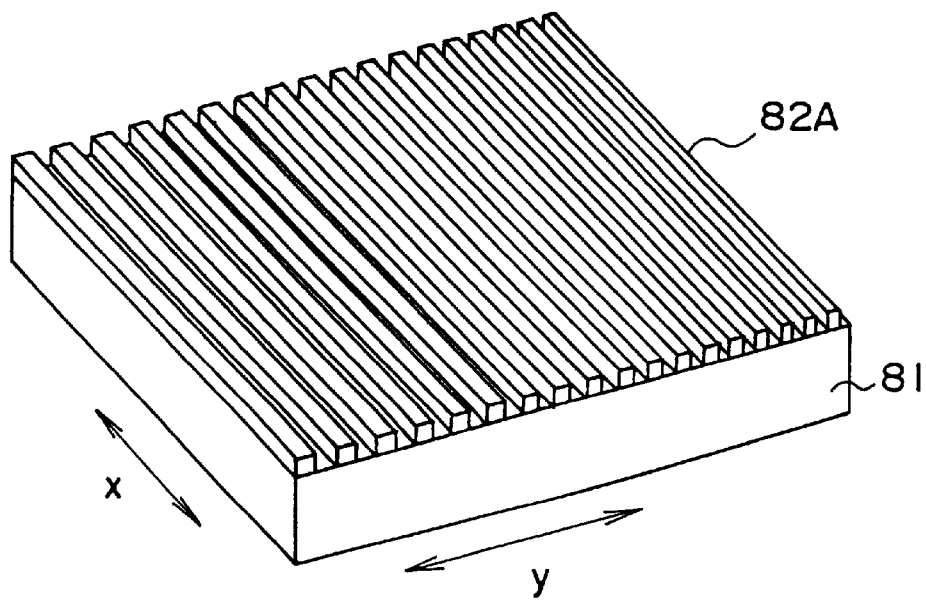

In the present embodiment, it should be noted that the exposure is carried out by disposing the prism 40 having the curved inclined surface 40A in the optical paths of the optical beams 41 and 42, such that the interference fringe pattern exposed on the resist film 82 is modified as explained with reference to FIG. 7B. Thus, the exposed interference fringe pattern is modified such that the pitch of repetition of the fringes in the y-direction, which is perpendicular to the x-direction, changes continuously in the x-direction. After development, a resist pattern 82A is obtained as indicated in FIG. 12B.

Figure 12C:
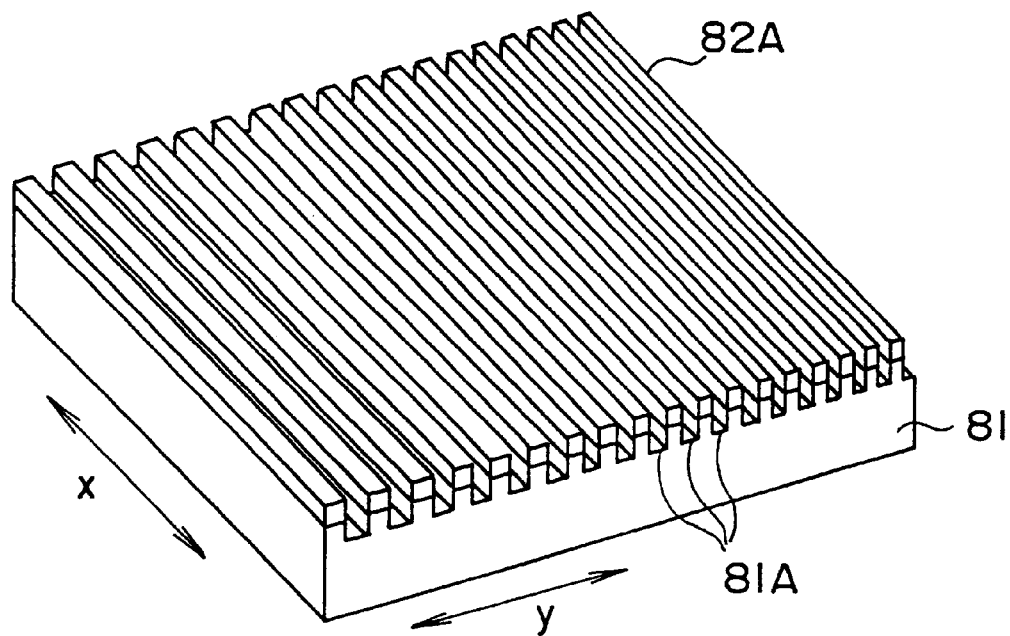

Next, in the step of FIG. 12C, the GaAs substrate 81 is subjected to a wet etching process while using the resist pattern 82A as a mask, and a number of grooves 81A are formed on the surface of the substrate 81 in correspondence to the resist pattern 82A typically with a depth of about 30 nm.

Figure 12D:
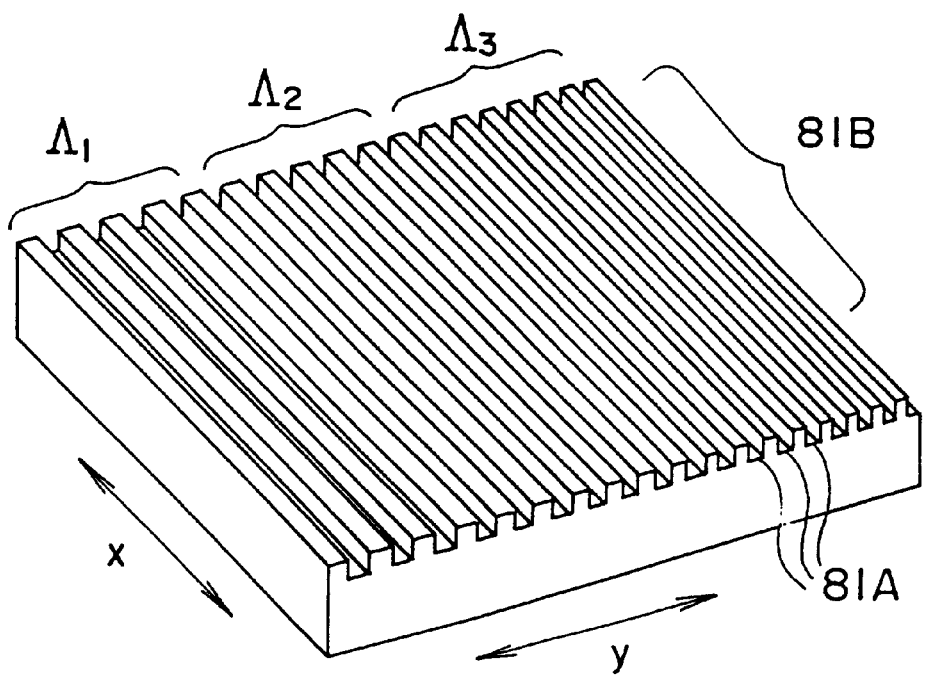

Further, in the step of FIG. 12D, the resist mask 82A is dissolved, and a structure is obtained in which the substrate 81 carries a diffraction grating pattern 81B formed of the foregoing grooves 81A. In FIG. 12D, it should be noted that the pitch $\underline{\Lambda}$ in the y-direction changes from $\underline{\Lambda}_1$ to $\underline{\Lambda}_2$ and from $\Lambda_2$ to $\Lambda_3$ in the y-direction, wherein there holds a relationship $\Lambda_1 > \Lambda_2 > \Lambda_3$.

Figure 12E:
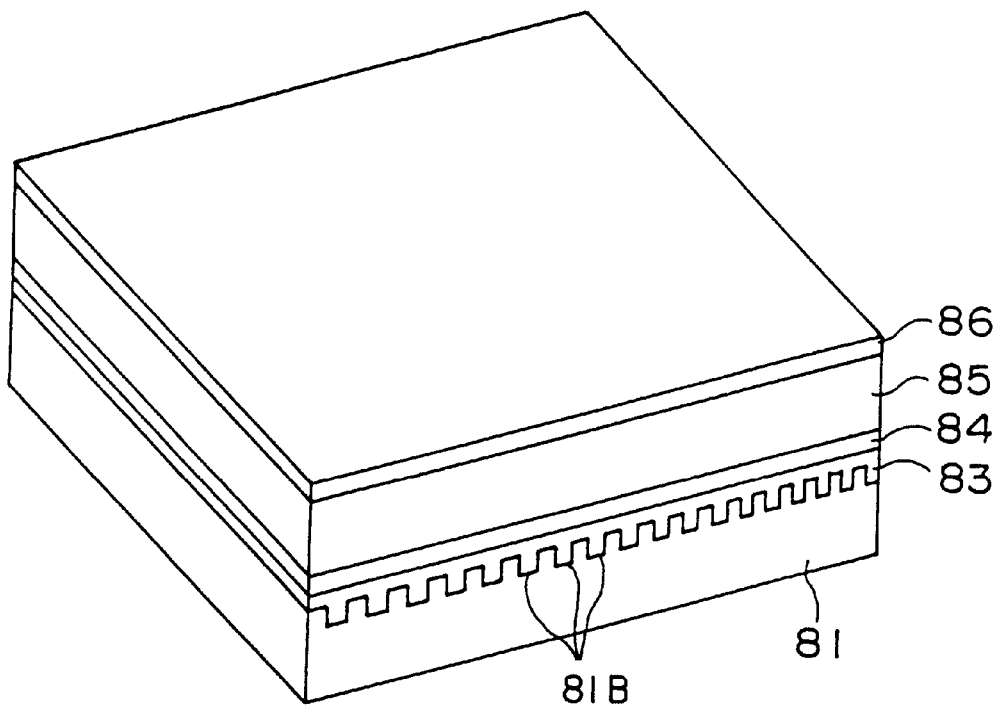

Next, in the step of FIG. 12E, the substrate 81 thus formed with the diffraction grating 81B is covered by an optical waveguide layer 83 of n-type AlGaAs by an MBE process or an MOVPE process, with a thickness of typically about 150 nm. Further, an active layer 84 of an MQW structure, in which an undoped barrier layer AlGaAs and an undoped quantum well layer are stacked alternately, is provided on the optical waveguide layer 83. Similarly as before, the each barrier layer and each quantum well layer have respective thicknesses of about 10 nm and about 6 nm, and the stacking of the barrier layer and the quantum well layer is repeated by about 60 times. As is well known in the art, quantum levels and associated quantized density of state are realized for the carriers in such a very thin quantum well layer.

On the active layer 84, a cladding layer 85 of p-type AlGaAs is formed, and a contact layer 86 of $p^+$-type GaAs is formed further on the cladding layer 85 thus formed.

Figure 12F:
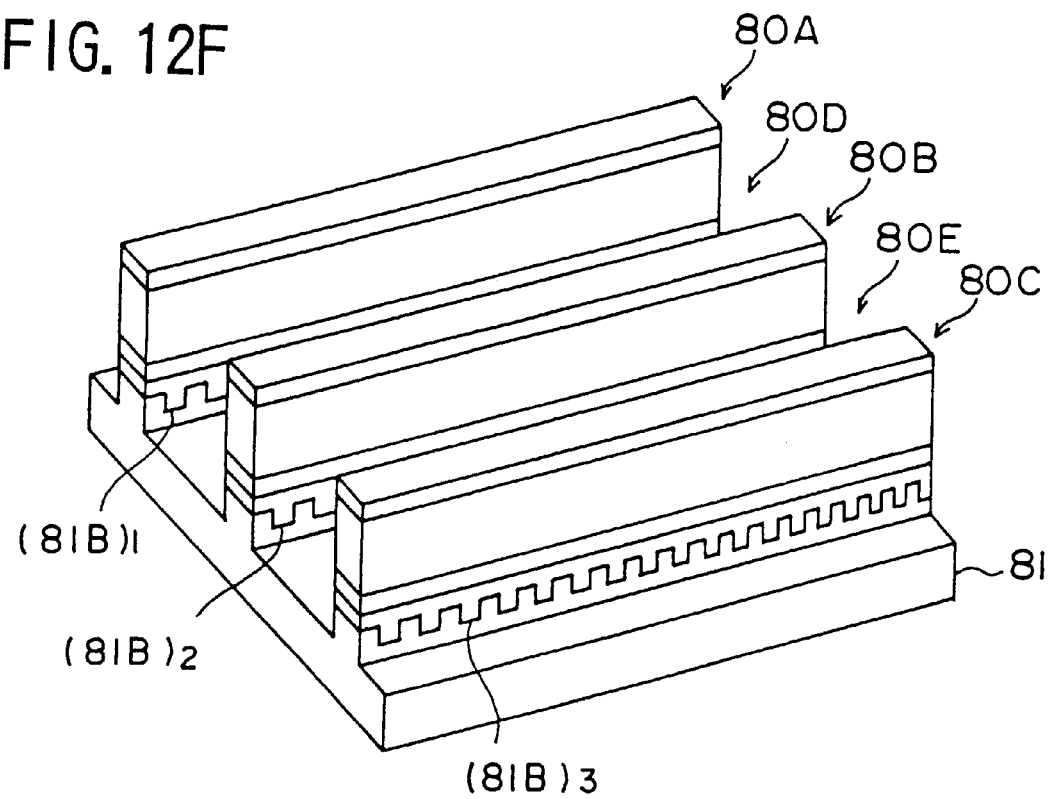

Next, in the step of FIG. 12F, the structure of FIG. 12E is subjected to a mesa etching process, and mesas 80A, 80B and 80C are formed on the substrate 81 with mutual separation caused by isolation grooves 80D and 80E. It should be noted that the isolation grooves 80D and 80E reach a level below the grooves 81A forming the diffraction grating pattern 81B, and thus, the diffraction grating pattern 81B of FIG. 12E is divided into diffraction gratings $(81B)_1$, $(81B)_2$ and $(81B)_3$ corresponding respectively to the mesas 80A, 80B and 80C, wherein the diffraction grating $(81A)_1$ has the pitch $\Lambda_1$, the diffraction grating $(81B)_1$ has the pitch $\Lambda_2$ and the diffraction grating $(81C)_1$ has the pitch $\Lambda_3$.

Figure 12G:
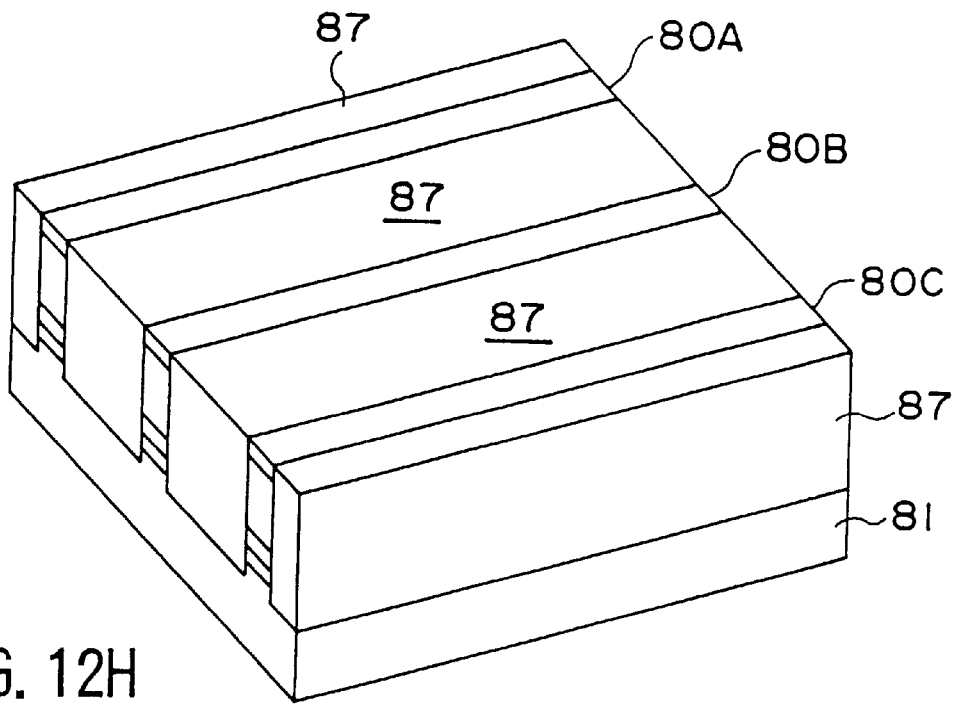

Next, in the step of FIG. 12G, the isolation grooves 80D and 80E are filled by a high resistance GaAs layer doped with a deep impurity element such as O to form a current confinement structure 87. Further, upper ohmic electrodes $(88A)_1$, $(88A)_2$, $(88A)_3$ are formed on the mesa structure 80A along an elongating direction thereof. Similarly, upper ohmic electrodes $(88B)_1$, $(88B)_2$ and $(88B)_3$ are formed on the mesa structure 80B along an elongating direction thereof, and upper ohmic electrodes $(88C)_1$, $(88C)_2$ and $(88C)_3$ are formed on the mesa structure 80B along an elongating direction thereof.

Figure 12H:
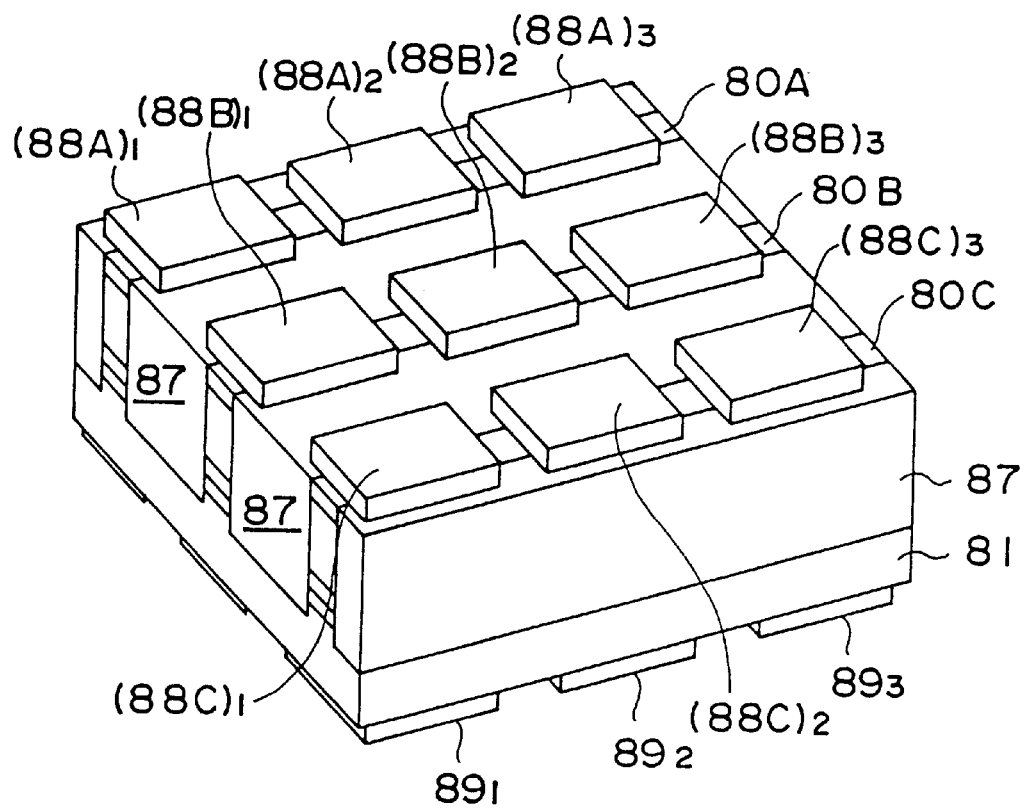
Figure 12I:
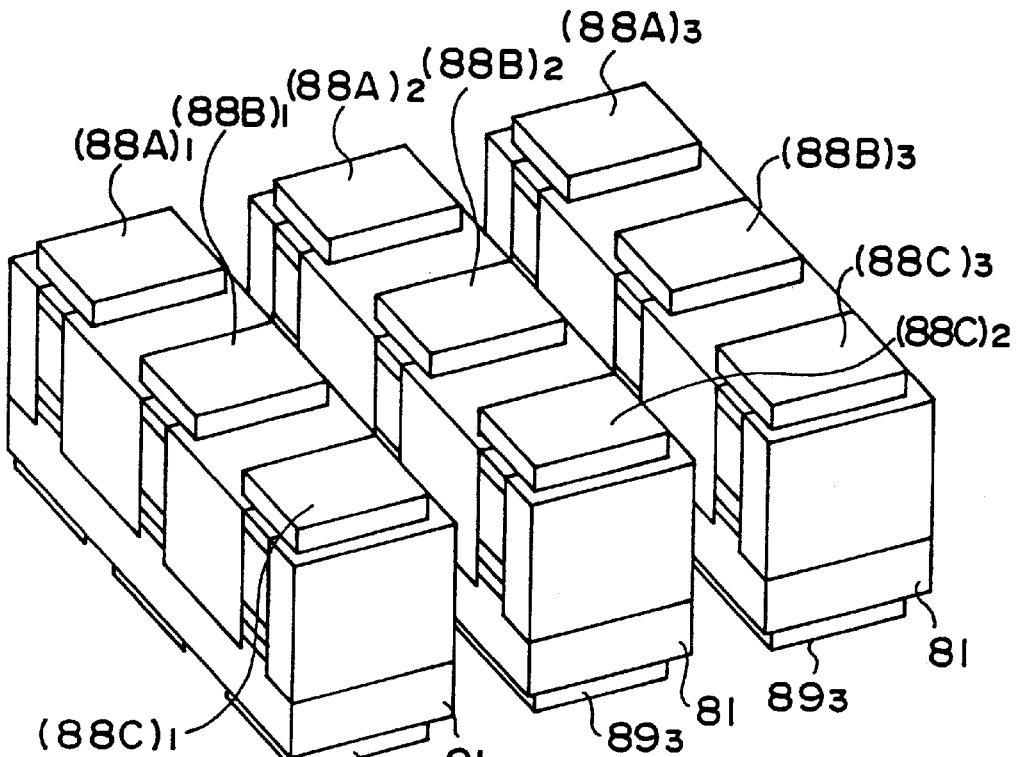
Figure 12J:
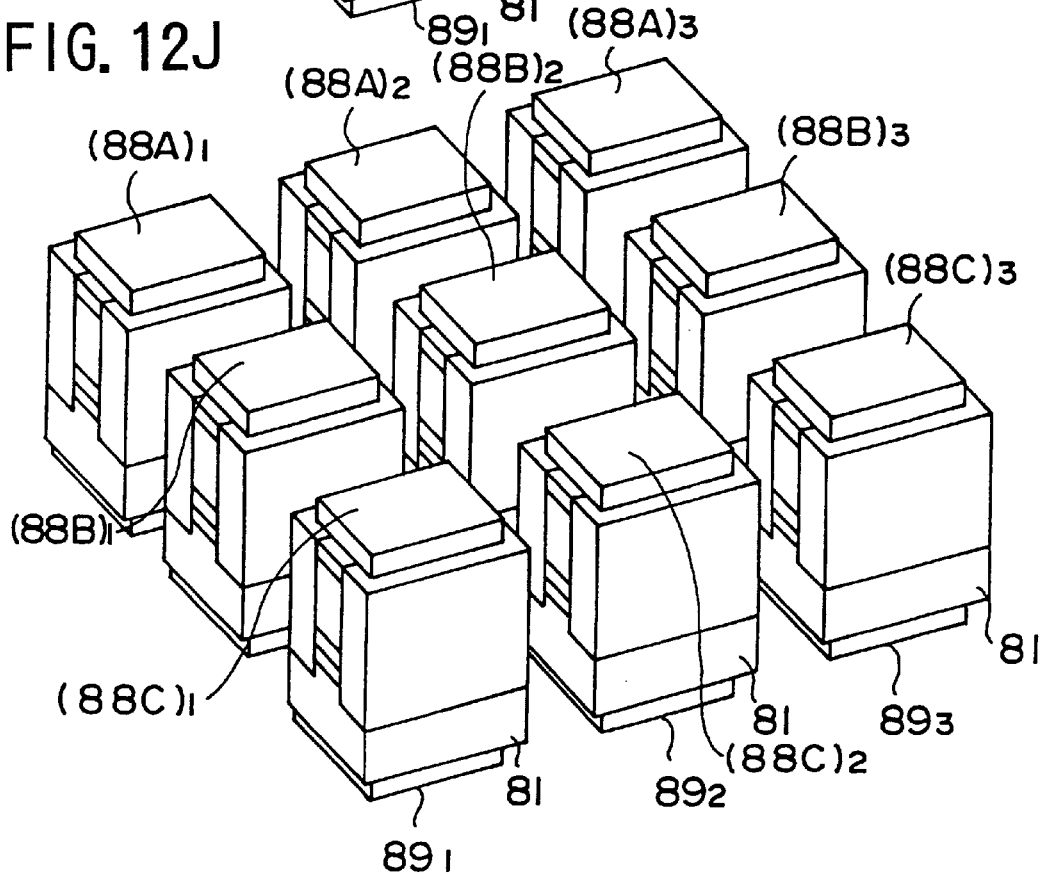

In the structure of FIG. 12H, it should be noted that a lower ohmic electrode $89_1$ is provided on the lower major surface of the substrate 81 in correspondence to the upper ohmic electrodes $(88A)_1$, $(88B)_1$ and $(88C)_1$ in a direction perpendicular to the elongating direction of the mesa 80A. Similarly, a lower ohmic electrode $89_2$ is provided on the lower major surface of the substrate 81 in correspondence to the upper ohmic electrodes $(88A)_2$, $(88B)_2$ and $(88C)_2$ in a direction perpendicular to the elongating direction of the mesa 80A, and a lower ohmic electrode $89_3$ is provided on the lower major surface of the substrate 81 in correspondence to the upper ohmic electrodes $(88A)_3$, $(88B)_3$ and $(88C)_3$ in a direction perpendicular to the elongating direction of the mesa 80A.

Thus, by cleaving the structure of FIG. 12H perpendicularly to the elongating direction of the mesas, along a row of the electrodes $(88A)_1$–$(88C)_1$, along a row of the electrodes $(88A)_2$–$(88C)_2$ and further along a row of the electrodes $(88A)_3$–$(88C)_3$, laser diode arrays are obtained with respective different diffraction grating pitches and hence different laser oscillation wavelengths. In each laser diode array of FIG. 12I, the laser diodes have the same diffraction grating pitch and hence the same laser oscillation wavelength.

Further, by cleaving each laser diode array into individual laser diodes, it is possible to obtain a large number of laser diodes having respective laser oscillation wavelengths.

Similarly to the previous embodiment, the present embodiment uses also the prism 40 that has a continuous inclined surface as indicated in FIG. 7A in the exposure process of the diffraction grating, wherein the manufacturing of such a prism 40 can be made without difficulty even in the case the laser diodes are formed on the substrate 81 with a reduced pitch or mutual separation. Further, the prism 40 lacks any steps on the surface thereof, and the exposed diffraction grating pattern 81B, and hence the diffraction gratings $(81A)_1$–$(81A)_3$, is inherently free from distortion caused by the diffraction of the optical beams 41 and 42.

Figure 13A:
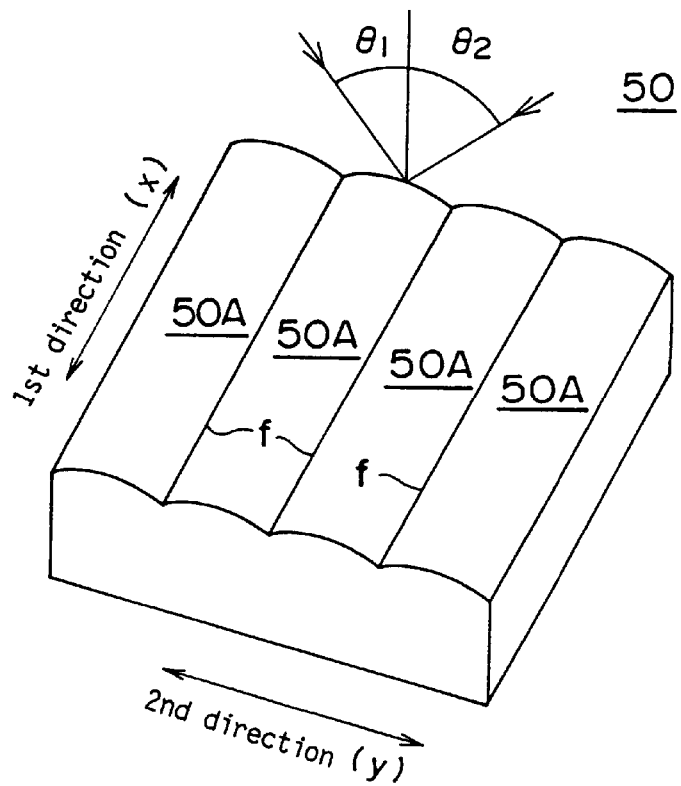
FIGS. 13A and 13B are diagrams showing a modification of the second embodiment.

FIG. 13A shows the construction of a prism 50 according to a modification of the prism 40 of the present embodiment. Further, FIG. 13B shows an exposure pattern of the diffraction grating formed by the prism 50.

Referring to FIG. 13A, the prism 50 is formed with a number of curved inclined surfaces 50A each having a similar shape to the curved inclined surface 40A of the prism 40, wherein the inclined surfaces 50A are repeated in the second direction or y-direction while changing the inclination angle alternately up and down. As a result, an inclined surface 50A continues to an adjacent inclined surface 50A at a creasing line f, without forming a step therebetween. By repeating the inclined surfaces 50A over the entire surface of the prism 50, it becomes possible to form the diffraction grating pattern of FIG. 12D repeatedly over the entire surface of the substrate 81, which may be an InP substrate.

Figure 13B:
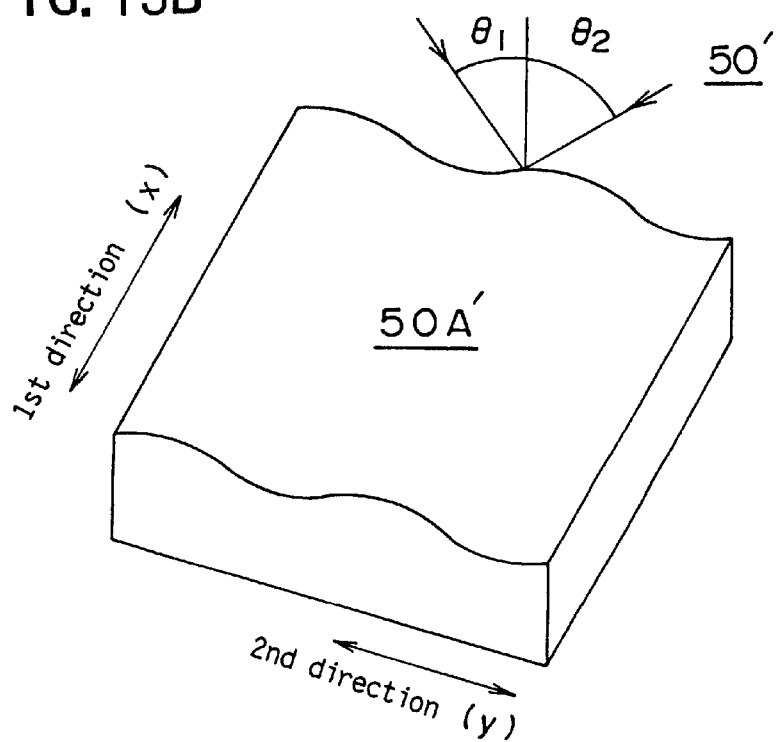

FIG. 13B shows a prism 50' according to another modification of the prism 40.

Referring to FIG. 13B, the prism 50' has a continuous, smooth undulating surface 50A' in place of the curved surfaces 50A of FIG. 13A. By using such a smooth undulating surface, the formation of creasing lines f is avoided and the problem of disturbance of the exposed interference fringe pattern is further reduced.

Third Embodiment

FIG. 15 and FIG. 16A–16C show the principle of a third embodiment of the present invention.

Figure 1:
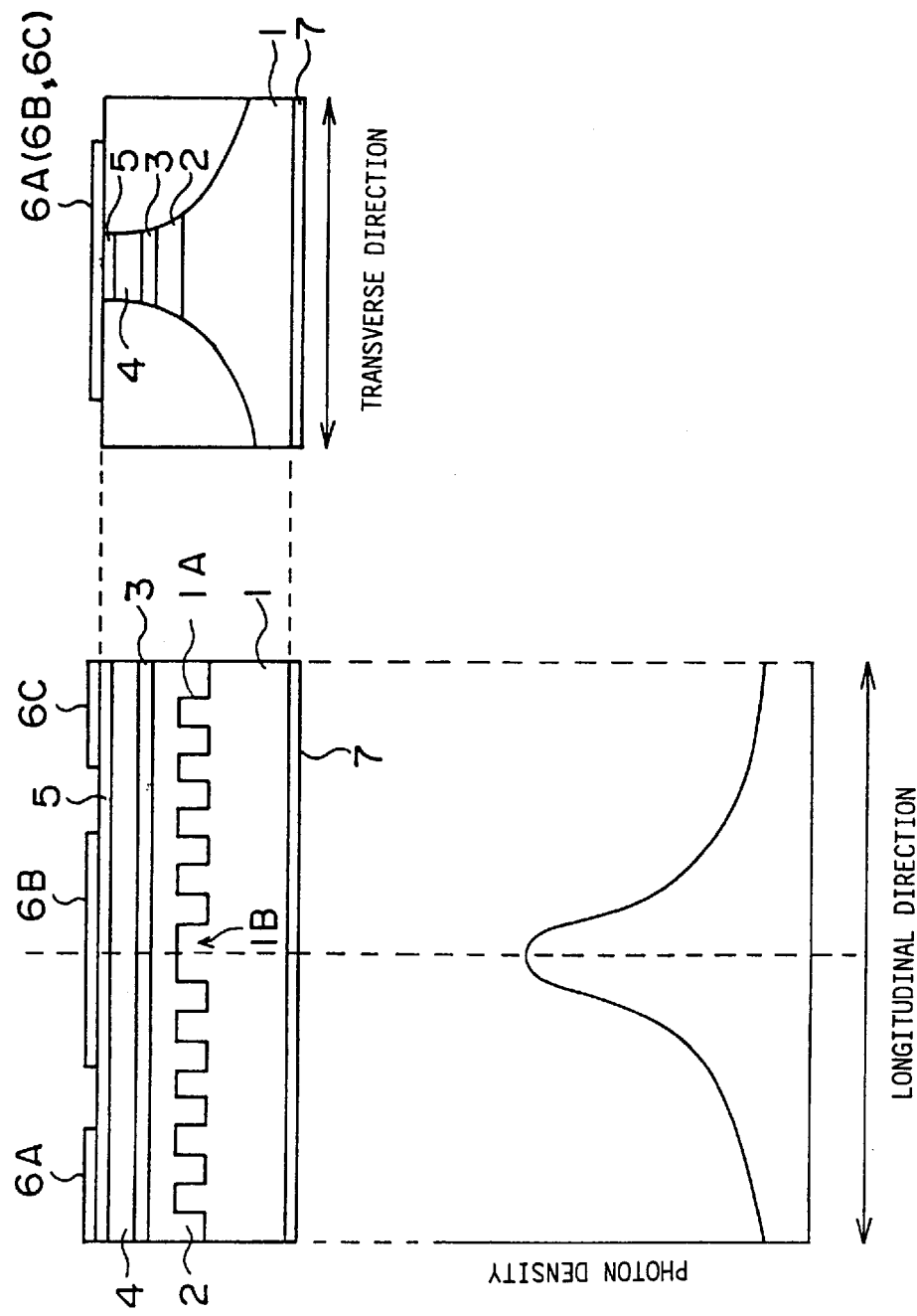
FIGS. 1A–1C are diagrams showing the construction of a conventional DFB laser diode.
Figure 2:
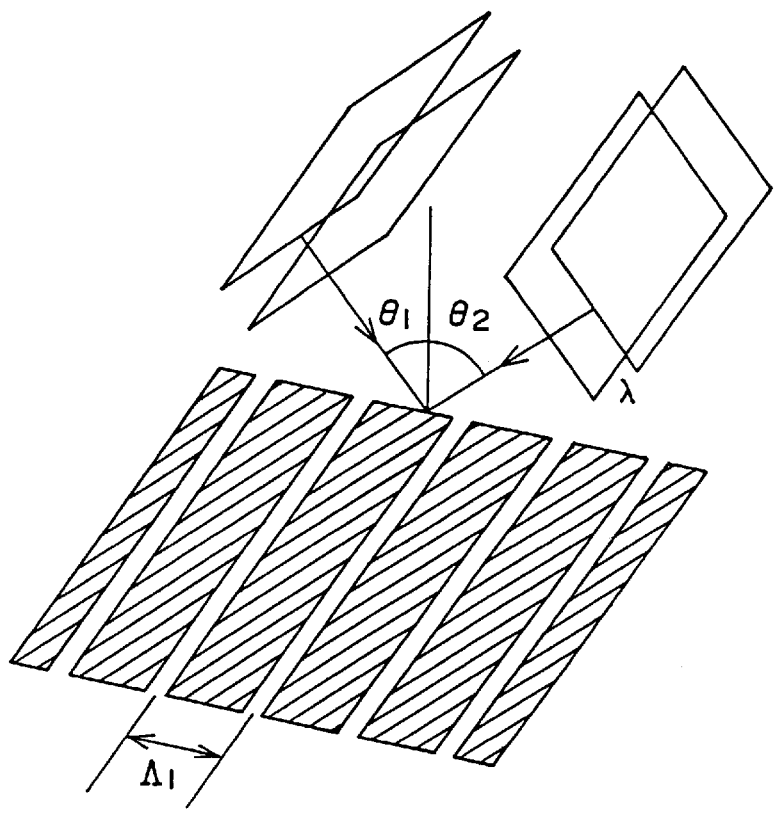
FIG. 2 is a diagram showing the principle of a conventional exposure process for forming a diffraction grating pattern of a DFB laser diode.

As noted already with reference to FIGS. 1A and 1B, the conventional DFB laser diode is provided with the $\Lambda/2$ phase shift point 1B in which the phase of the diffraction grating is shifted by $\Lambda/2$ for inducing a maximum in the photon density in correspondence thereto.

Figure 14:
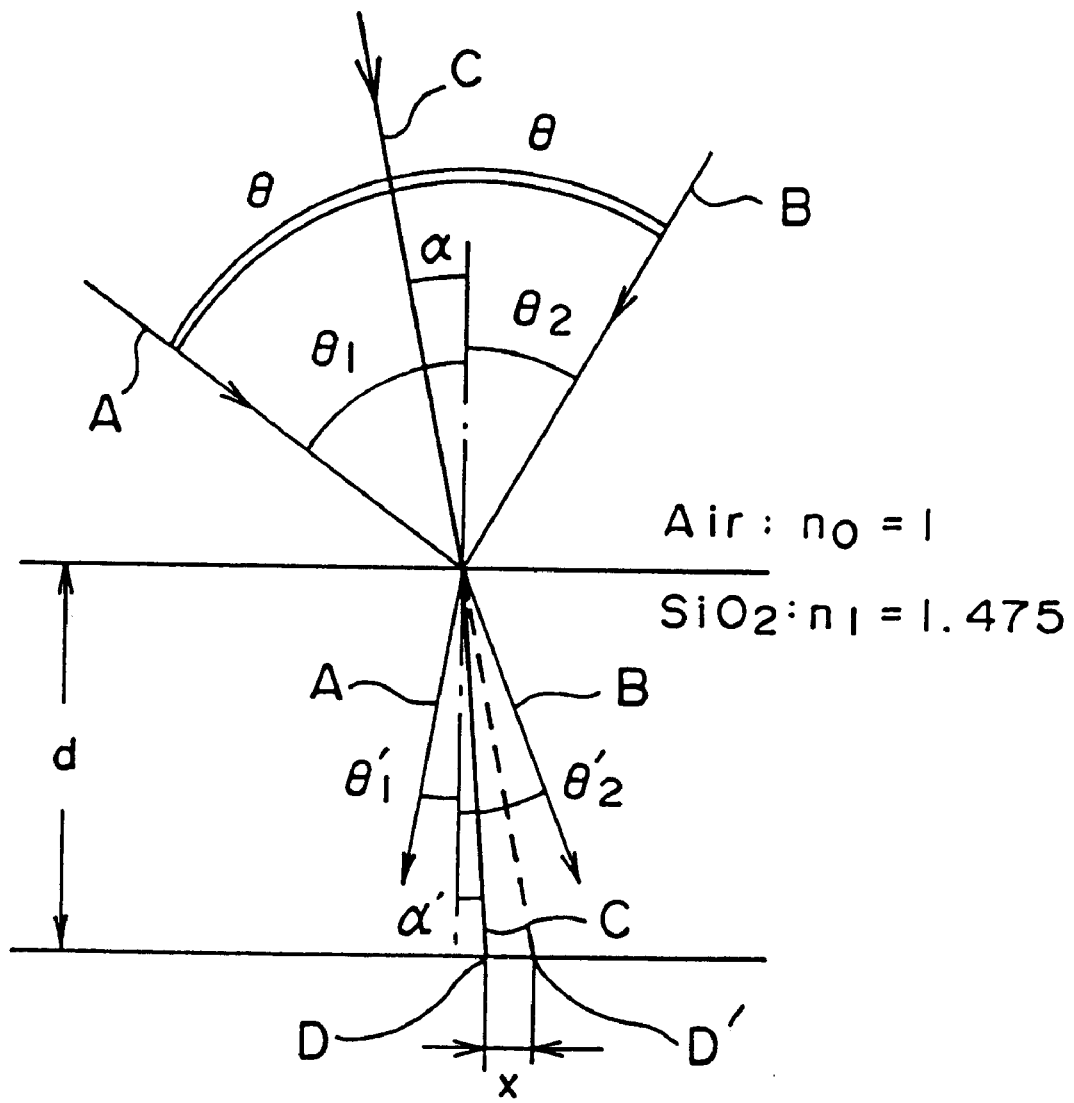
FIG. 14 is a diagram explaining the principle of a third embodiment of the present invention.

FIG. 14 shows the principle of the exposure mask that is used for exposing a diffraction grating pattern that includes such a phase shift region 1B.

Referring to FIG. 14, the exposure mask includes a glass slab of $SiO_2$ having a refractive index of 1.475 and a thickness d, to which first and second coherent optical beams A and B are impinged with respective incident angles $\Theta_1$ and $\Theta_2$ from the side of the air that has a refractive index $n_0$ of 1.

The incident optical beams A and B experience a refraction with respective refraction angles $\Theta_1'$ and $\Theta_2'$, wherein the incident optical beams A and B induce an apparent optical beam C as a result of interference. The optical beam C impinges thereby upon the mask along a bisecting line of the angle formed by the optical beams A and B, with an incident angle $\alpha$.

The optical beam C thus impinged on the mask is then refracted, when passing therethrough, with a refraction angle $\alpha'$ and reaches an exit point D after crossing the thickness d of the glass slab forming the mask, wherein the exit point D is offset by a distance x with respect to an ideal point D' to which the optical beam C reaches when there were no refraction. Thus, it becomes possible to control the position of the diffraction grating pattern on the substrate, by providing the mask in the optical paths of the optical beams A and B and by suitably setting the thickness d, such that the diffraction grating pattern at the left-side of the $\Lambda/2$ phase shift point 1B is shifted by $\pi$ radian with respect to the diffraction grating pattern at the right-side.

Figure 15:
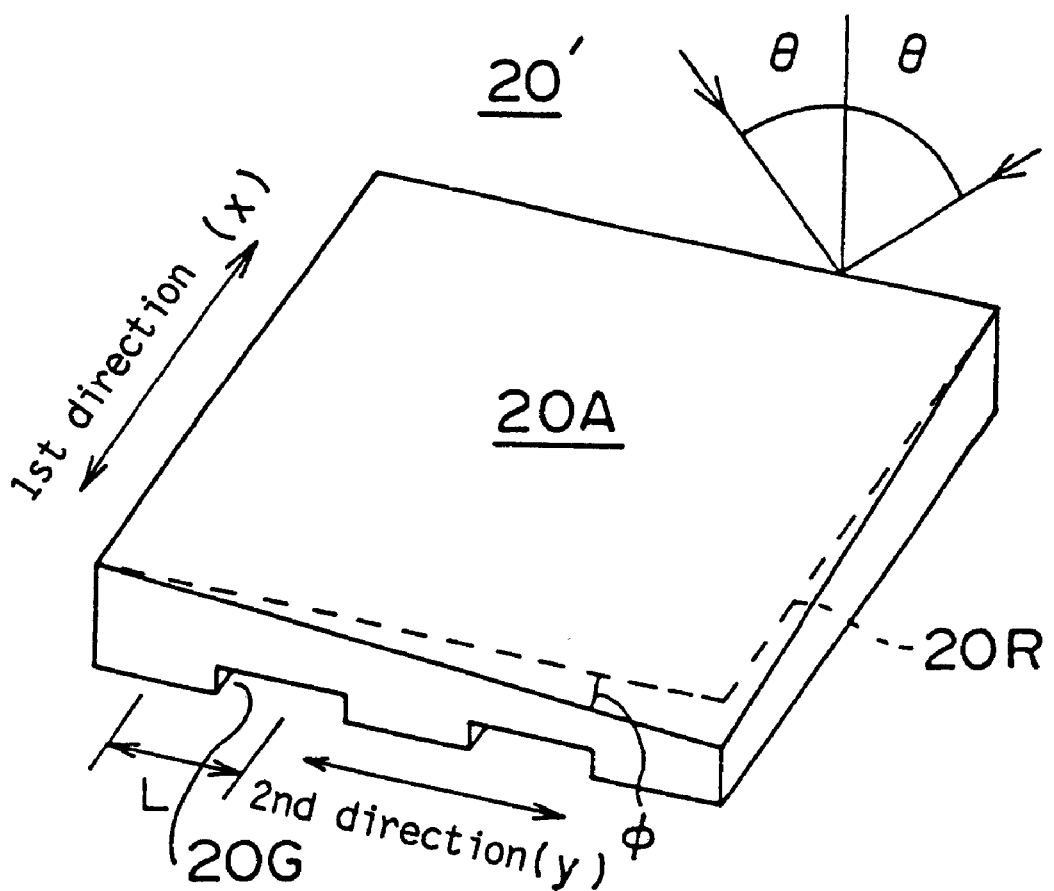
FIG. 15 is diagram showing a prism used in the exposure process according to the third embodiment.

FIG. 15 shows the construction of a prism 20' that forms such a $\Lambda/2$ phase shift region, wherein the prism 20' is a modification of the prism 20 and those parts corresponding to the parts described with reference to the prism 20 are designated by the same reference numerals.

Referring to FIG. 15, the prism 20' is formed with grooves 20G extending in the x-direction at a bottom surface thereof with a repetition in the y-direction with a pitch L, in which the pitch L is set equal to the length of the DFB laser diode to be formed. By using the prism 20' in the exposure process of the diffraction grating pattern, the exposed diffraction grating pattern can be formed to have a continuously varying pitch, as measured in the y-direction, along the x-direction similarly to the diffraction grating pattern of FIG. 10D, wherein the diffraction grating pattern thus formed further includes a $\Lambda/2$ phase shift point similar to the $\Lambda/2$ phase shift point 1B of FIG. 1A, generally at a central part of the diffraction grating pattern as viewed in the y-direction.

Figure 16A:
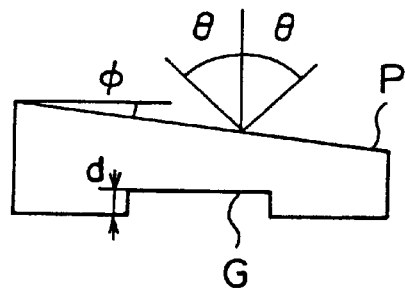
FIGS. 16A–16C are diagrams showing the function of the prism of FIG. 15.
Figure 16B:
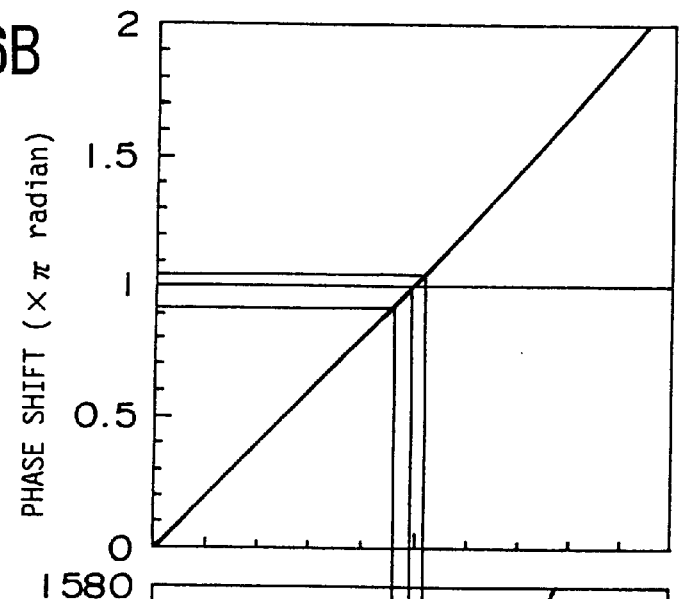
Figure 16C:
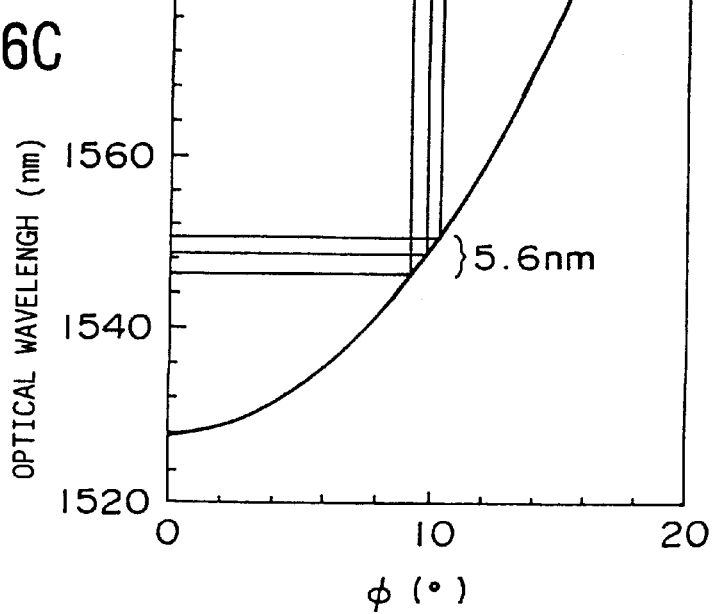

FIGS. 16B and 16C respectively show the deviation in the phase of the $\Lambda/2$ phase shift point 1B and the deviation in the oscillation wavelength of the DFB laser diode that is formed by using the prism 20' of FIG. 16A for the exposure of the diffraction grating pattern. In FIG. 16A, it should be noted that the prism 20' has a grove G at the bottom surface thereof with a depth d set to 2.0 $\mu$m, and the calculation of FIGS. 16B and 16C was made by changing the inclination angle $\phi$ of the prism 20' from 0° to 20°. In the calculation, it was assumed that the two optical beams hit the prism 20' with an identical incident angle $\Theta$ set to 42.9°.

Referring to FIG. 16B, it will be noted that the deviation in the $\Lambda/2$ phase shift point falls within a range of 0.08$\pi$ radians as long as the deviation of the oscillation wavelength of the laser diode is within 5.6 nm with respect to a central wavelength of 1.55 $\mu$m. Thus, the single mode characteristics or the threshold characteristics of the DFB laser diode for the wavelength multiplex applications are not influenced substantially by the use of the prism 20'.

Figure 17:
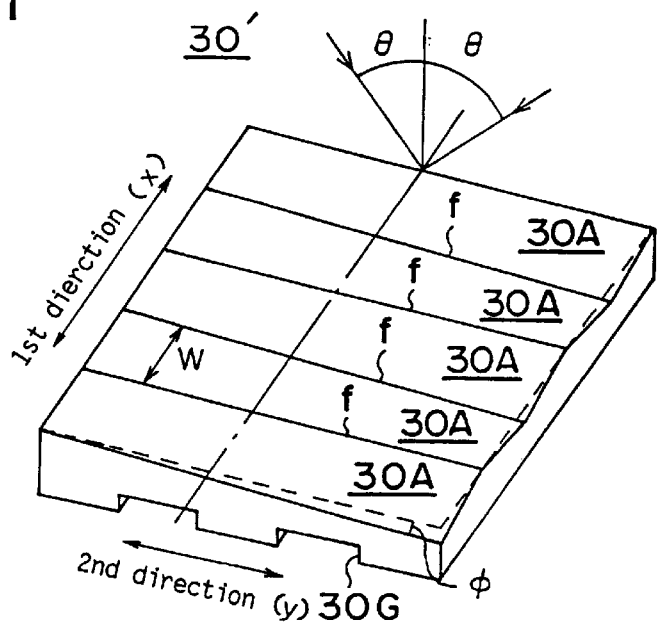
FIG. 17 is a diagram showing a modification of the prism of FIG. 15.

FIG. 17 shows a prism 30' as a modification of the prism of FIG. 15 modified according to the embodiment of FIG. 11A. Referring to FIG. 17, the prism 30' includes a number of the inclined surfaces 30A repeated in the x-direction. Further, the prism 30' includes grooves 30G similar to the groove 20G of the prism 20' at a bottom surface thereof. By using the prism 30' of FIG. 17, it is possible to form the diffraction grating pattern that includes a $\Lambda/2$ phase shift point repeatedly over the wafer surface by a single exposure process.

Figure 18:
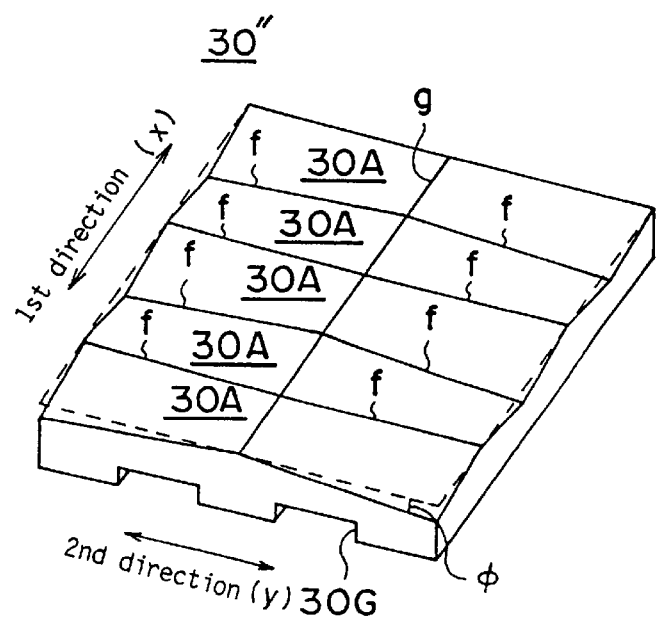
FIG. 18 is a diagram showing a further modification of the prism of FIG. 15.

FIG. 18 shows a prism 30" that is a further modification of the prism 30" of FIG. 17.

Referring to FIG. 18, the prism 30" includes the sloped surfaces 30A such that the sloped surface 30A is not only repeated in the x-direction at the creasing lines f but also repeated in the y-direction at the creasing line g. By using the prism 30", it becomes possible to expose the diffraction grating that includes the $\Lambda/2$ phase shift region over the entire surface of the wafer.

Figure 19:
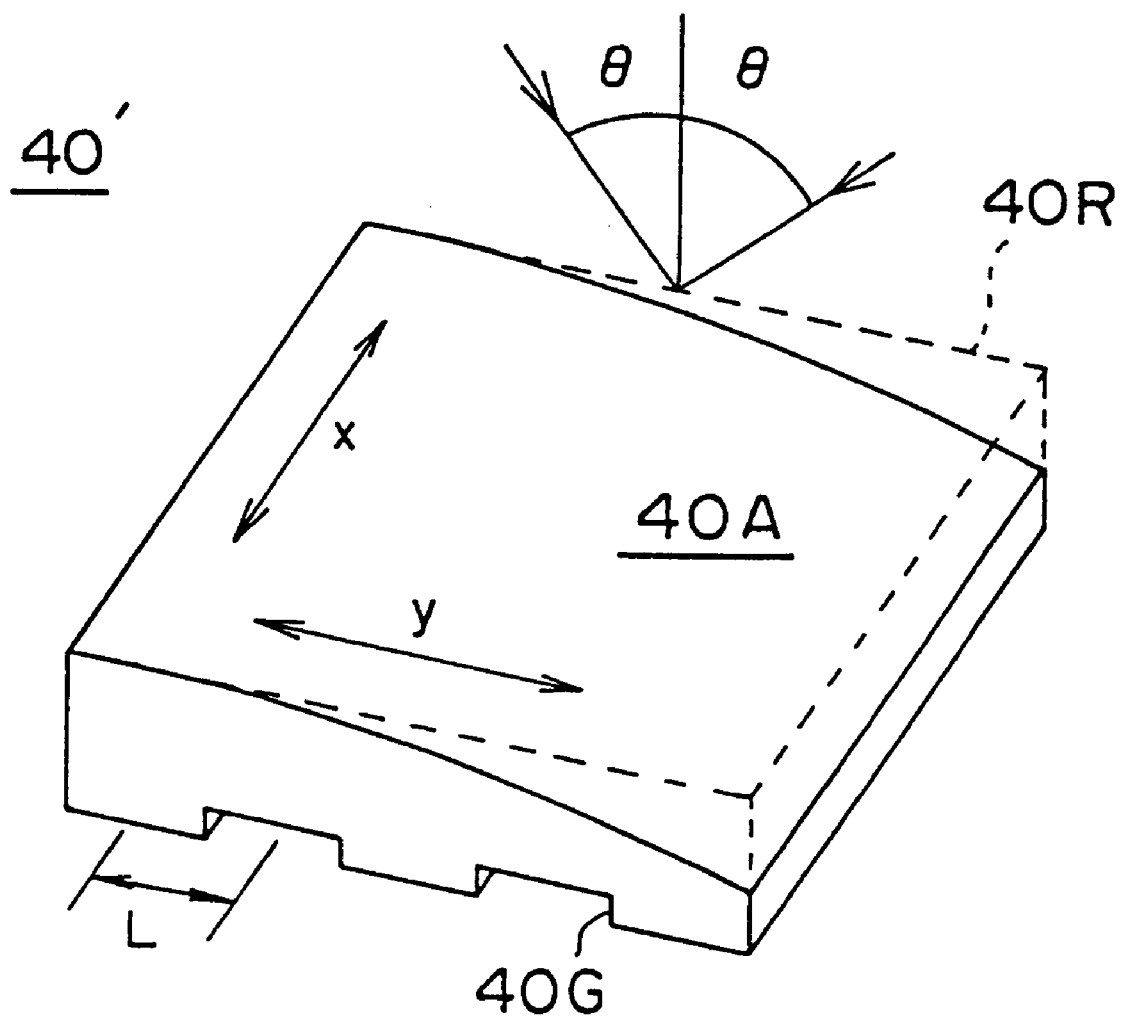
FIG. 19 is a diagram showing a further modification of the prism of FIG. 15.

FIG. 19 shows a prism 40' according to a modification of the prism 40, wherein those parts corresponding to the parts described previously are designated by the same reference numerals and the description thereof will be omitted.

Referring to FIG. 19, the prism 40' carries, on the bottom surface thereof, grooves 40G having a depth d and each extending in the x-direction, wherein the grooves 40G are repeated in the y-direction with a pitch L set generally equal to the length of the DFB laser diode to be formed. By using the prism 40' in the exposure process, the diffraction grating pattern exposed on the substrate includes a _/2 phase shift region in correspondence to the stepped part formed by the groove 40G. The diffraction grating pattern itself has a shape similar to the diffraction grating pattern of FIG. 12D in which the diffraction grating pitch as measured in the y-direction changes continuously in the y-direction, except that the diffraction grating pattern now includes a phase shift point similar to the phase shift point 1B of FIG. 1A. The phase shift point is formed generally at the central part when viewed in the y-direction.

Figure 20:
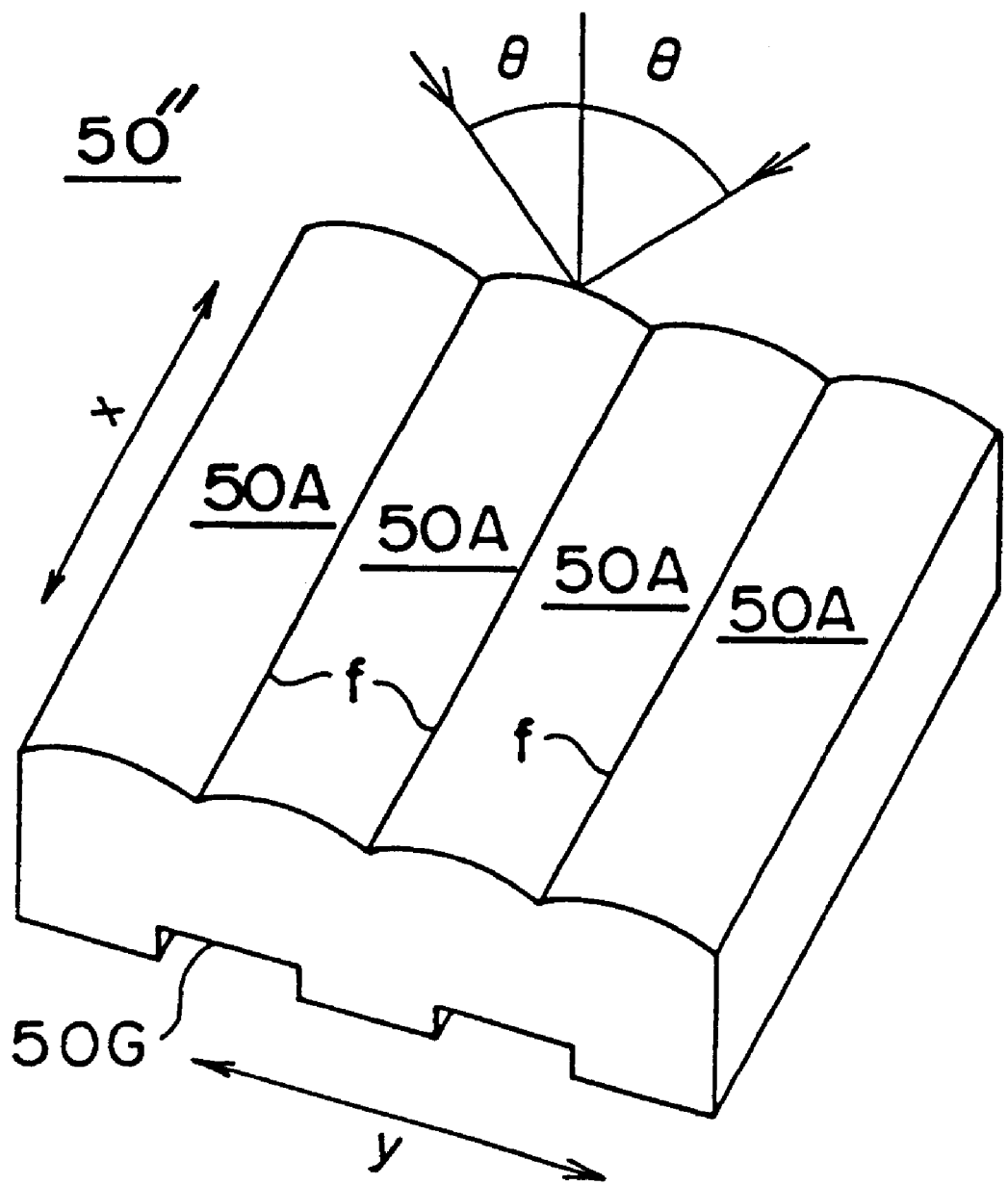
FIG. 20 is a diagram showing a further modification of the prism of FIG. 15.

FIG. 20 shows a prism 50" as a modification of the prism 50 of FIG. 13A modified according to the embodiment of FIG. 19, wherein it should be noted that the prism 50" includes a groove 50G at a bottom surface thereof similarly to the groove 40G of the prism 40'. By using the prism of FIG. 20, it is possible to form a diffraction grating that includes a $\Lambda/2$ phase shift region and that changes the pitch in the y-direction, on the wafer repeatedly in the y-direction.

Figure 21:
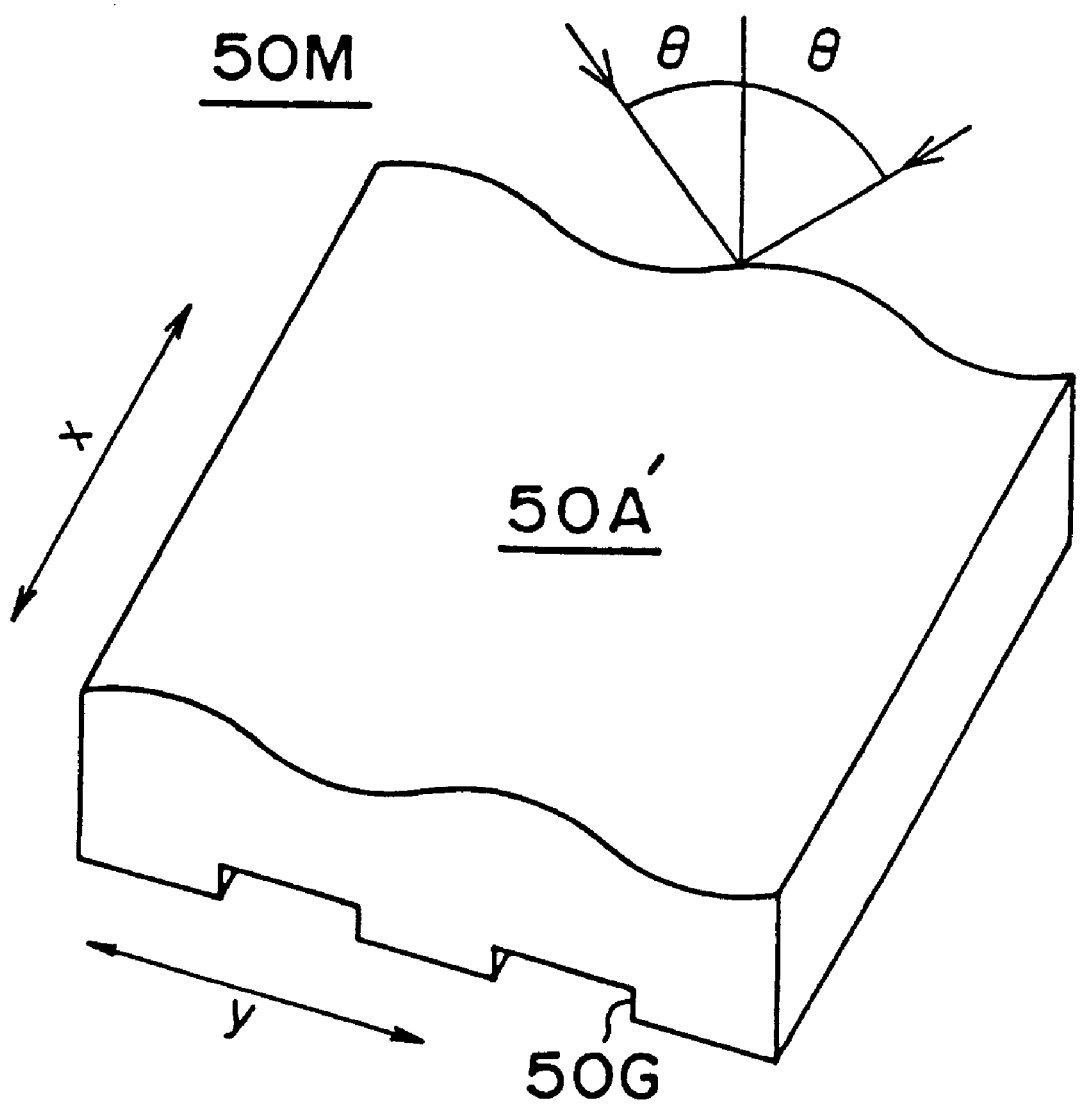
FIG. 21 is a diagram showing a further modification of the prism of FIG. 15.

FIG. 21 shows a construction of the prism 50M as a further modification of the prism 50" of FIG. 20.

Referring to FIG. 21, the prism 50" includes a smooth undulating surface corresponding to the surface 50A', and the prism 50M exposes a diffraction grating pattern including a $\Lambda/2$ phase shift point over the entire surface of the wafer such that the grating pitch changes in the y-direction.

In any of the foregoing embodiments, except for the embodiments in which a $\Lambda/2$ phase shift region is formed, it should be noted that the prism 20 or 40 may be used upside down. Further, a prism that have a concaved inclined surface may also be used in place of the prism such as the prism of FIG. 13A that has a convex inclined surface.

Further, the present invention is not limited to the embodiments described heretofore, but various variations and modifications may be made without departing from the scope of the invention.

What is claimed is:

1. An optical semiconductor device, comprising:
   a semiconductor substrate having a first conductivity type and extending in first and second directions;
   a diffraction grating pattern provided on said semiconductor substrate and including a plurality of grooves generally extending in said first direction, said grooves being repeated in said second direction with a pitch such that said pitch changes continuously along said grooves in said first direction;
   an optical waveguide layer provided on said semiconductor substrate so as to cover said diffraction grating pattern;
   an active layer provided on said optical waveguide layer;
   a cladding layer having a second conductivity type and provided on said active layer; and
   a conductor layer provided on said cladding layer with said second conductivity type.

2. An optical semiconductor device, comprising:
   a semiconductor substrate having a first conductivity type and extending in first and second directions;
   a diffraction grating pattern provided on said semiconductor substrate and including a plurality of grooves generally extending in said first direction, said grooves being repeated in said second direction with a pitch such that said-pitch changes continuously in said second direction;

an optical waveguide layer provided on said semiconductor substrate so as to cover said diffraction grating pattern;

an active layer provided on said optical waveguide layer;

a cladding layer having a second conductivity type and provided on said active layer; and a conductor layer provided on said cladding layer with said second conductivity type.

3. A laser diode array, comprising:

a semiconductor substrate having a first conductivity type and extending in first and second directions;

a plurality of mesa regions each provided on said semiconductor substrate so as to extend in said second direction, each of said mesa regions being defined by first and second side walls and repeated in said second direction;

a diffraction grating pattern provided in each of said mesa regions, said diffraction grating pattern including a plurality of grooves each extending generally in said first direction and repeated in said second direction with a pitch, such that the pitch measured in said second direction changes continuously in said first direction from said first side wall to said second side wall;

an optical waveguide layer provided on said diffraction grating pattern in each of said mesa structures;

an active layer provided on said optical waveguide layer in each of said mesa structures;

a cladding layer provided on said active layer in each of said mesa structures;

first electrode means provided on said cladding layer in each of said mesa structures for injecting first type carriers having a first polarity;

second electrode means provided on said substrate for injecting second type carriers having a second polarity;

each of said grooves that forms said diffraction grating pattern in each of said plurality of mesa structures being aligned with a corresponding groove on an adjacent mesa structure on an imaginary line extending generally in said first direction across said plurality of mesa structures, such that a plurality of said imaginary lines are repeated in said second direction with a pitch that changes continuously in said first direction.

4. An optical semiconductor device, comprising:

a semiconductor substrate having a first conductivity type and extending in first and second directions;

a plurality of mesa regions each provided on said semiconductor substrate so as to extend in said second direction, each of said mesa regions being defined by first and second side walls and repeated in said second direction;

a diffraction grating pattern provided in each of said mesa regions, said diffraction grating pattern including a plurality of grooves each extending generally in said first direction and repeated in said second direction with a pitch, such that the pitch measured in said second direction changes continuously in said second direction along said mesa structure;

an optical waveguide layer provided on said diffraction grating pattern in each of said mesa structures;

an active layer provided on said optical waveguide layer in each of said mesa structures;

a cladding layer provided on said active layer in each of said mesa structures;

first electrode means provided on said cladding layer in each of said mesa structures for injecting first type carriers having a first polarity;

second electrode means provided on said substrate for injecting second type carriers having a second polarity;

each of said grooves that forms said diffraction grating pattern in each of said plurality of mesa structures being aligned with a corresponding groove on an adjacent mesa structure on an imaginary line extending generally in said first direction across said plurality of mesa structures, such that a plurality of said imaginary lines are repeated in said second direction with a pitch that changes continuously in said second direction.

* * * * *